(12) United States Patent
Park et al.

(10) Patent No.: US 10,153,214 B2
(45) Date of Patent: Dec. 11, 2018

(54) PATTERNING METHOD AND A METHOD OF FABRICATING A SEMICONDUCTOR DEVICE USING THE SAME

(71) Applicant: Samsung Electronics Co., Ltd., Suwon-si, Gyeonggi-do (KR)

(72) Inventors: Se Jung Park, Hwaseong-si (KR); Ju-Hyun Kim, Hwaseong-si (KR); Hoyoung Kim, Seongnam-si (KR); Boun Yoon, Seoul (KR); TaeYong Kwon, Suwon-si (KR); Sangkyun Kim, Hwaseong-si (KR); Sanghyun Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/386,843

(22) Filed: Dec. 21, 2016

(65) Prior Publication Data
US 2017/0207130 A1    Jul. 20, 2017

(30) Foreign Application Priority Data
Jan. 15, 2016    (KR) ........................ 10-2016-0005533

(51) Int. Cl.
*H01L 27/088*    (2006.01)
*H01L 29/78*    (2006.01)
(Continued)

(52) U.S. Cl.
CPC .............. *H01L 21/823807* (2013.01); *H01L 21/30625* (2013.01); *H01L 21/31053* (2013.01);
(Continued)

(58) Field of Classification Search
CPC ....... H01L 21/823807; H01L 21/30625; H01L 21/31053
See application file for complete search history.

(56) References Cited

U.S. PATENT DOCUMENTS 6,825,086 B2    11/2004    Lee et al.
6,855,607 B2    2/2005    Achuthan et al.
(Continued)

FOREIGN PATENT DOCUMENTS

JP    2014187259 A    10/2014
KR    101062986 B1    9/2011
(Continued)

*Primary Examiner* — Brian Turner
(74) *Attorney, Agent, or Firm* — Harness, Dickey & Pierce, P.L.C.

(57) ABSTRACT

A patterning method for fabricating a semiconductor device includes forming, for example sequentially forming, a lower buffer layer, a first channel semiconductor layer, and a capping insulating layer on a substrate, forming an opening to penetrate the capping insulating layer and the first channel semiconductor layer and expose a portion of the lower buffer layer, forming a second channel semiconductor layer to fill the opening and include a first portion protruding above the capping insulating layer, performing a first CMP process to remove at least a portion of the first portion, removing the capping insulating layer, and performing a second CMP process to remove at least a portion of a second portion of the second channel semiconductor layer protruding above the first channel semiconductor layer.

19 Claims, 20 Drawing Sheets

(51) Int. Cl.
  *H01L 21/8238* (2006.01)
  *H01L 29/66* (2006.01)
  *H01L 21/84* (2006.01)
  *H01L 21/3105* (2006.01)
  *H01L 21/306* (2006.01)
  *H01L 27/092* (2006.01)

(52) U.S. Cl.
  CPC ........... *H01L 21/823814* (2013.01); *H01L 21/823828* (2013.01); *H01L 21/823878* (2013.01); *H01L 27/092* (2013.01)

(56) References Cited

U.S. PATENT DOCUMENTS

| | | |
|---|---|---|
| 6,927,414 B2 | 8/2005 | Ouyang et al. |
| 7,476,580 B2 | 1/2009 | Zhu et al. |
| 7,569,442 B2 | 8/2009 | Ouyang et al. |
| 7,629,220 B2 | 12/2009 | Orlowski |
| 7,875,543 B1 | 1/2011 | Luo et al. |
| 7,902,012 B2 | 3/2011 | Ouyang et al. |
| 8,012,820 B2 | 9/2011 | Majumdar et al. |
| 8,153,526 B2 | 4/2012 | Lee et al. |
| 8,575,653 B2 | 11/2013 | Rachmady et al. |
| 8,847,281 B2 | 9/2014 | Cea et al. |
| 8,871,615 B2 | 10/2014 | Mori |
| 8,877,579 B2 | 11/2014 | Song et al. |
| 9,093,533 B2 | 7/2015 | Cheng et al. |
| 2008/0217686 A1 | 9/2008 | Majumdar et al. |
| 2008/0227295 A1 | 9/2008 | Chen |
| 2008/0268587 A1* | 10/2008 | Sadaka ........... H01L 21/823807 438/199 |
| 2011/0230030 A1* | 9/2011 | de Souza .......... H01L 21/26506 438/303 |
| 2014/0008730 A1* | 1/2014 | Mitard ................. H01L 27/092 257/369 |
| 2014/0308808 A1* | 10/2014 | Cheng ............... H01L 29/66545 438/595 |
| 2014/0353760 A1 | 12/2014 | Loubet et al. |
| 2014/0367741 A1* | 12/2014 | Yang ....................... H01L 29/04 257/190 |

FOREIGN PATENT DOCUMENTS

| | | |
|---|---|---|
| KR | 20120133652 A | 12/2012 |
| KR | 101310434 B1 | 9/2013 |
| KR | 101424755 B1 | 7/2014 |
| KR | 101461348 B1 | 11/2014 |
| KR | 20150023440 A | 3/2015 |

\* cited by examiner

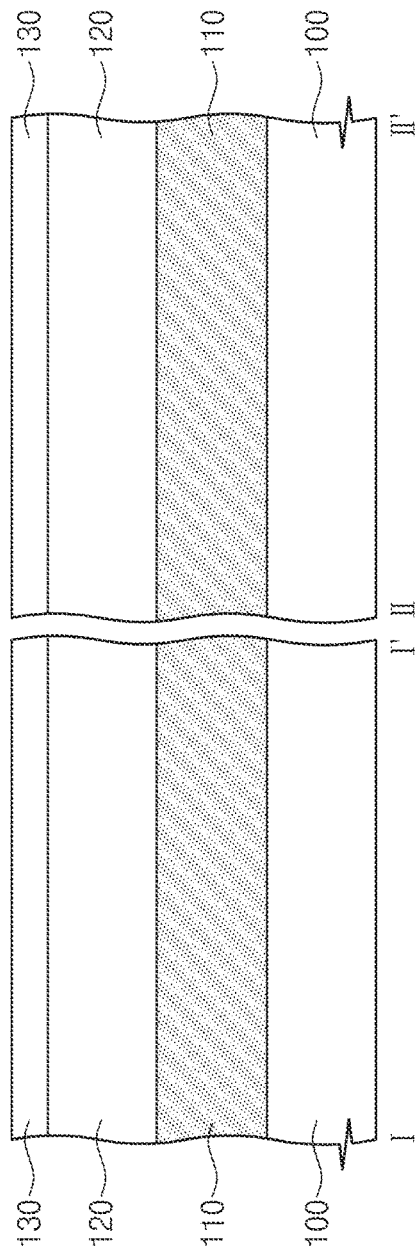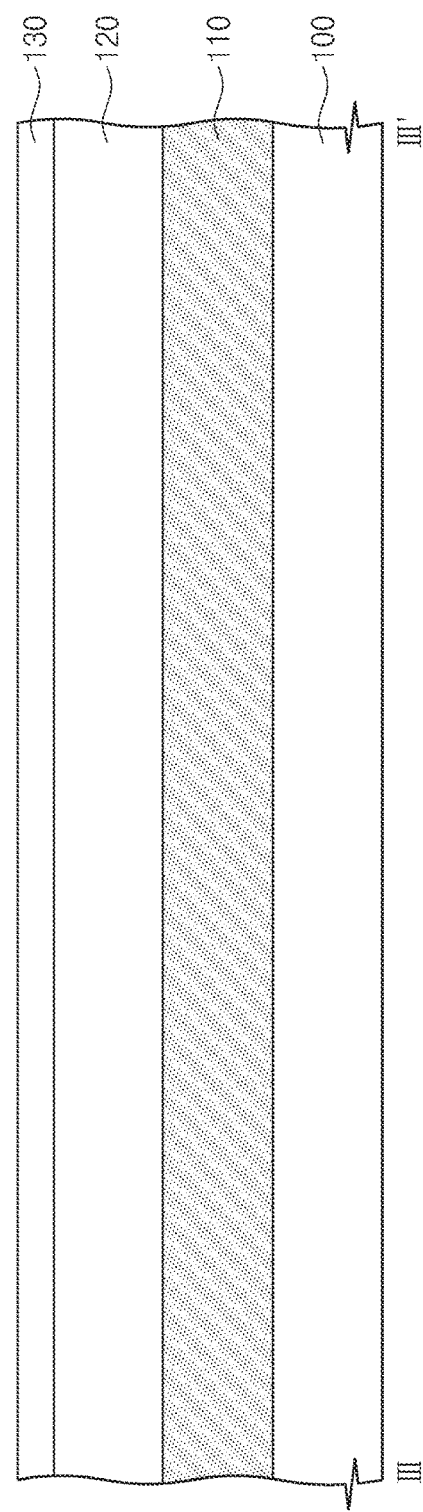

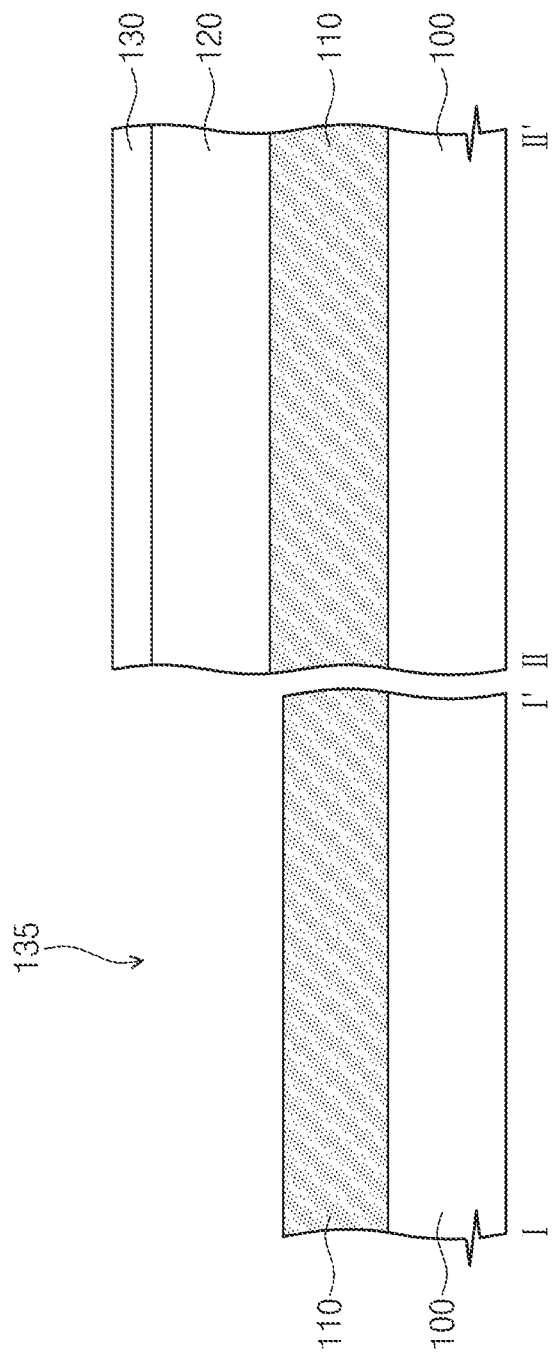

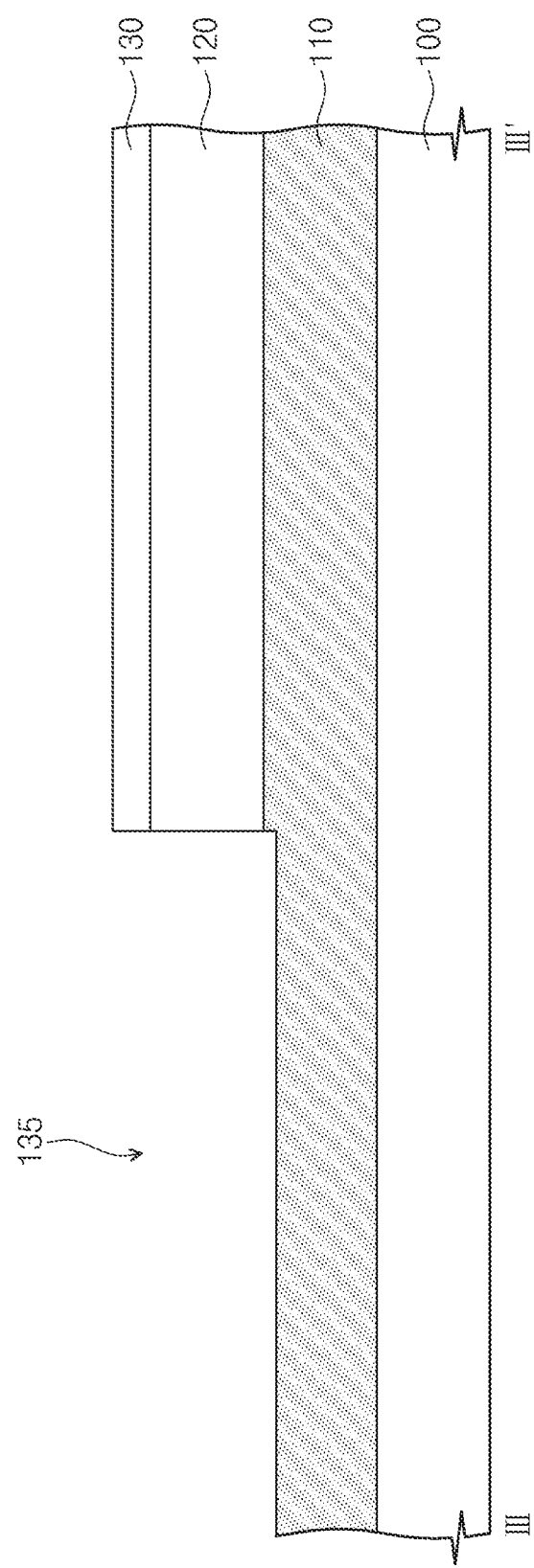

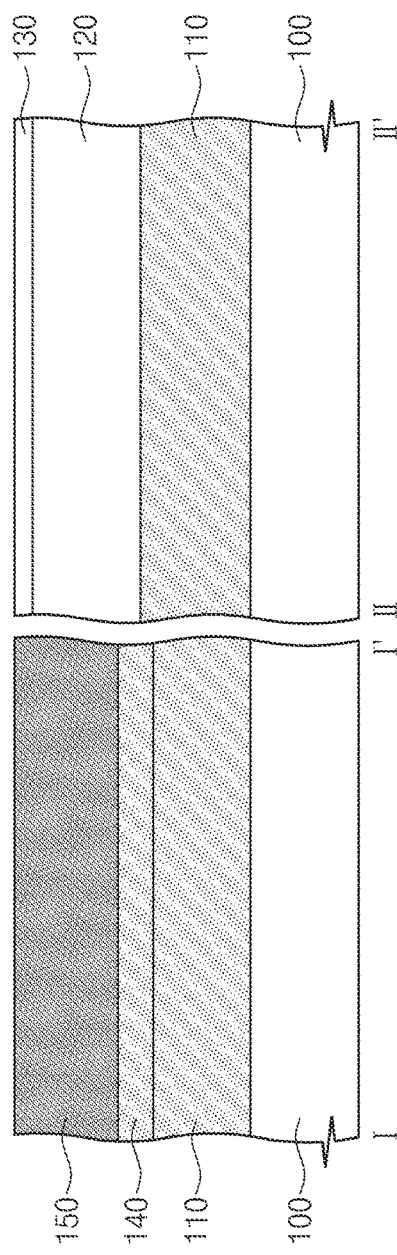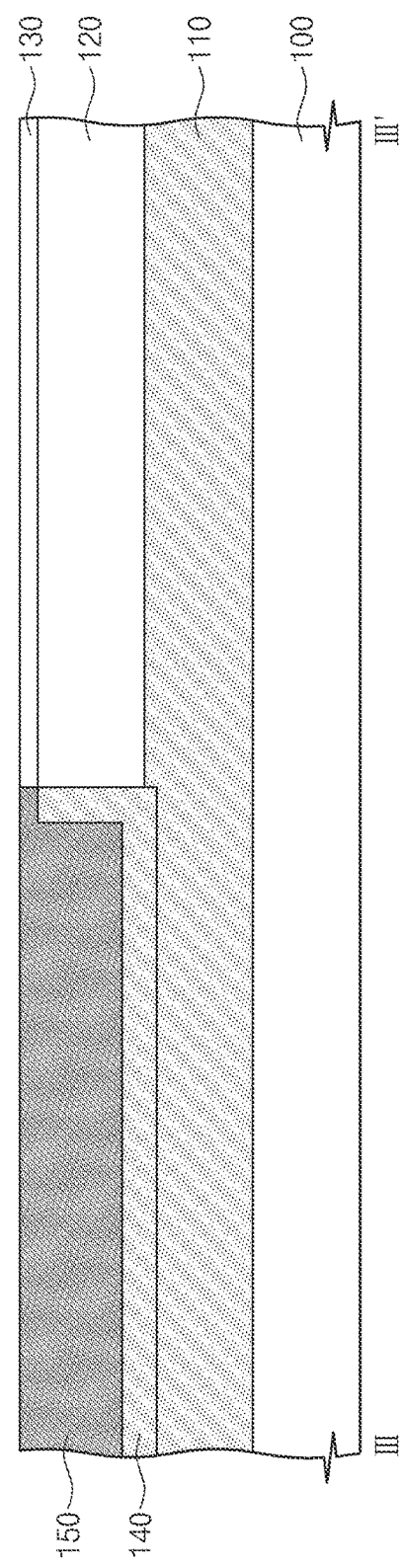

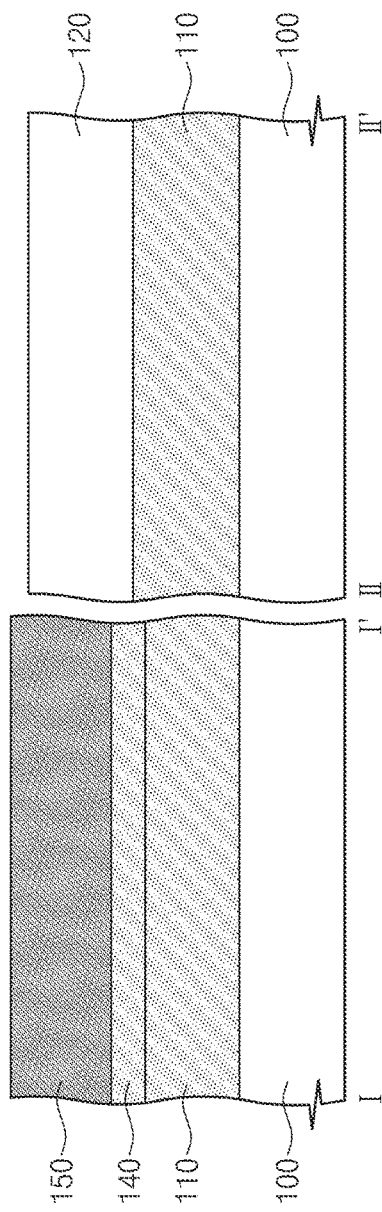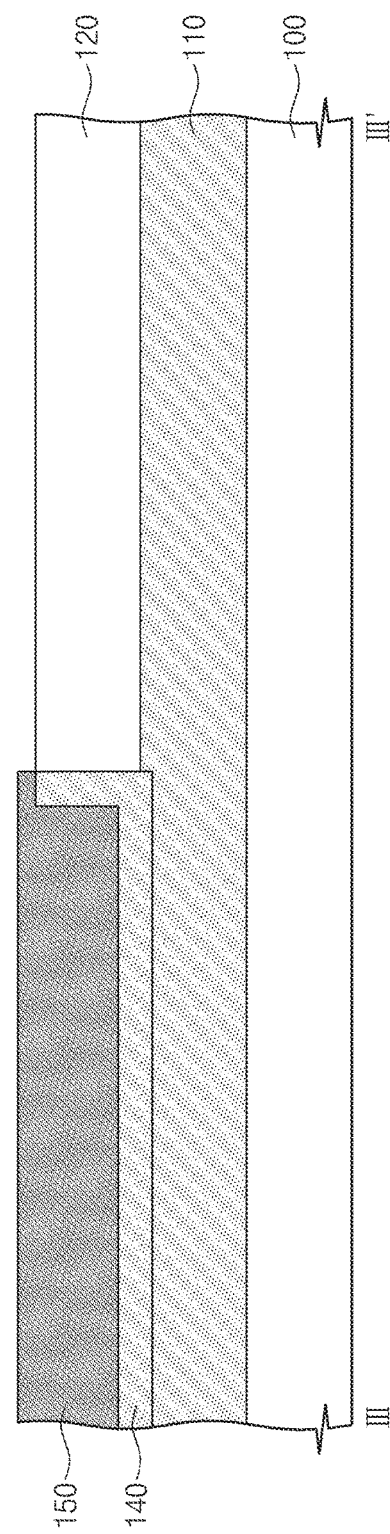

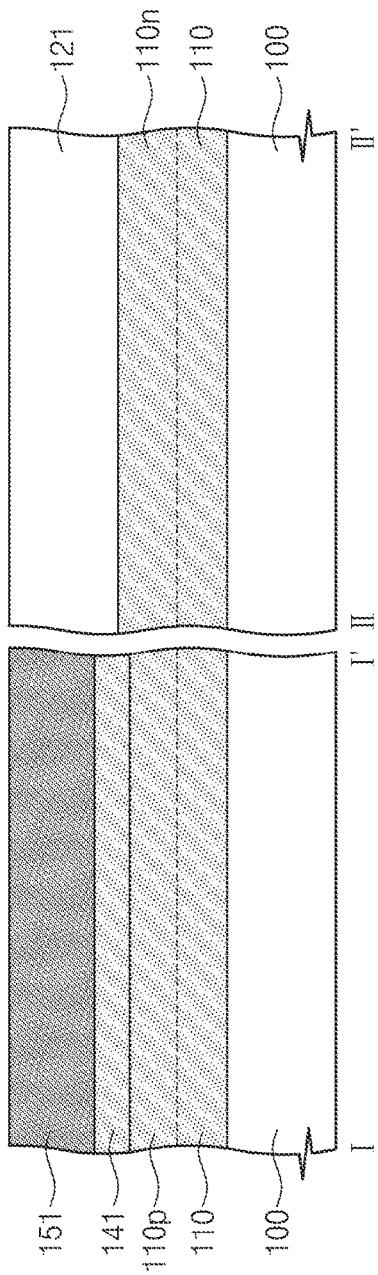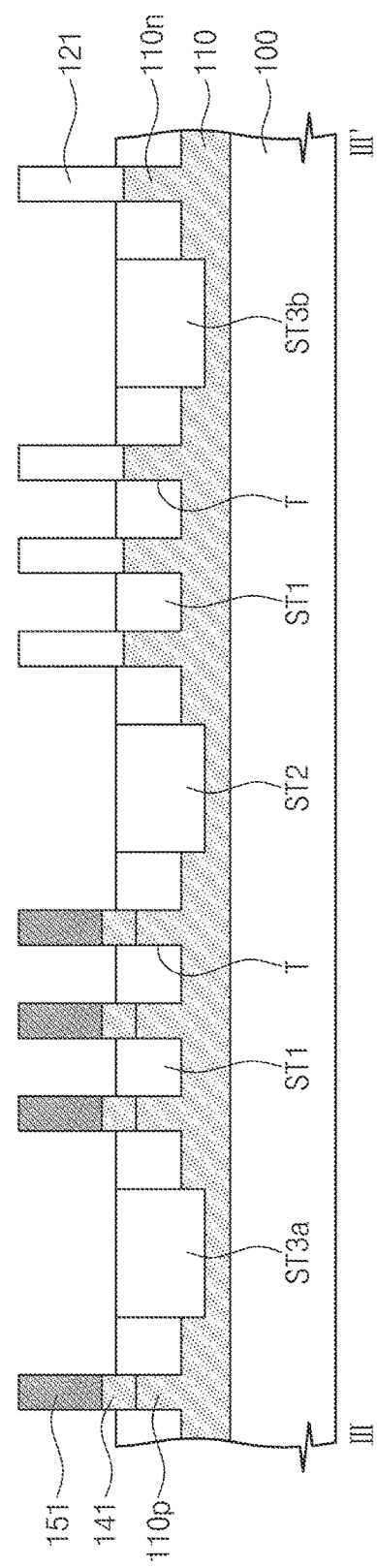

PATTERNING METHOD AND A METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2016-0005533, filed on Jan. 15, 2016, in the Korean Intellectual Property Office, the entire contents of which are hereby incorporated by reference.

BACKGROUND

1. Field

Some example embodiments relate to a patterning method, a method of fabricating a semiconductor device using the same, and/or a method of fabricating a field effect transistor having a channel region, to which strain is exerted.

2. Description of the Related Art

A semiconductor device may include integrated circuits (ICs) consisting of or including metal-oxide-semiconductor field-effect transistors (MOS-FETs). As a size and a design rule of the semiconductor device decrease, the MOS-FETs are being scaled down. This may lead to various technical problems, such as a short channel effect or deteriorated operation characteristics of the semiconductor device. Many studies are being conducted to realize a high performance semiconductor device and to overcome the technical problems. Especially, in order to realize a high performance field effect transistor, a technology for increasing mobility of carriers (e.g., electrons or holes) is intensively researched.

SUMMARY

Some example embodiments of the inventive concepts provide a patterning method, allowing a semiconductor device to have an improved charge mobility property.

Other example embodiments of the inventive concepts provide a method of fabricating a semiconductor device with an improved charge mobility property.

According to an example embodiment of the inventive concepts, a patterning method for fabricating a semiconductor device includes forming, for example sequentially forming a lower buffer layer, a first channel semiconductor layer, and a capping insulating layer on a substrate, the first channel semiconductor layer including a material whose lattice constant is lower than the lattice constant of the lower buffer layer, forming an opening to penetrate the capping insulating layer and the first channel semiconductor layer and to expose a portion of the lower buffer layer, forming a second channel semiconductor layer to fill the opening, the second channel semiconductor layer including a first portion protruding upwardly with respect to a top surface of the capping insulating layer and including a material whose lattice constant is higher than the lattice constant of the lower buffer layer, performing a first CMP process to remove at least a portion of the first portion of the second channel semiconductor layer, removing the capping insulating layer to expose a top surface of the first channel semiconductor layer, and performing a second CMP process to remove at least a portion of a second portion of the second channel semiconductor layer protruding upwardly with respect to the top surface of the first channel semiconductor layer. The first CMP process may be performed using a first CMP slurry. The second CMP process may be performed using a second CMP slurry, which is selected to allow the second semiconductor layer to be polished at a lower polishing rate than the polishing rate of the first CMP slurry.

According to another example embodiment of the inventive concepts, a method of fabricating a semiconductor device includes preparing a substrate having a logic cell region, the logic cell region comprising an NMOSFET region and a PMOSFET region, forming a first channel semiconductor pattern and a second channel semiconductor pattern on the NMOSFET region and the PMOSFET region, respectively, and forming a gate electrode to cross both of the first and second channel semiconductor patterns. The forming of the first and second channel semiconductor patterns may include forming, for example sequentially forming a lower buffer layer, a first channel semiconductor layer, and a capping insulating layer on the substrate, removing a portion of the capping insulating layer and a portion of the first channel semiconductor layer to form an opening exposing the lower buffer layer on the PMOSFET region, forming a second channel semiconductor layer to fill the opening and include a first portion protruding upwardly with respect to a top surface of the capping insulating layer, performing a first CMP process to remove at least a portion of the first portion of the second channel semiconductor layer, removing the capping insulating layer to expose a top surface of the first channel semiconductor layer, and performing a second CMP process to remove at least a portion of a second portion of the second channel semiconductor layer protruding upwardly with respect to the top surface of the first channel semiconductor layer, and patterning the first and second channel semiconductor layers to form trenches defining the first and second channel semiconductor patterns. The first CMP process may be performed using a first CMP slurry, and the second CMP process may be performed using a second CMP slurry, which is selected to allow the second semiconductor layer to be polished at a lower polishing rate than the polishing rate of the first CMP slurry.

Some example embodiments relate to a method of fabricating a semiconductor device, the method including forming a first buffer layer and a first channel semiconductor layer on a substrate, forming an opening in a portion of the first channel semiconductor layer to expose the first buffer layer, forming a second buffer layer in the opening, forming a second channel semiconductor layer on the second buffer layer to fill the opening, and planarizing the second channel semiconductor layer by removing a protruding portion of the second channel semiconductor layer with respect to the first channel semiconductor layer via polishing.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

Figure 1:
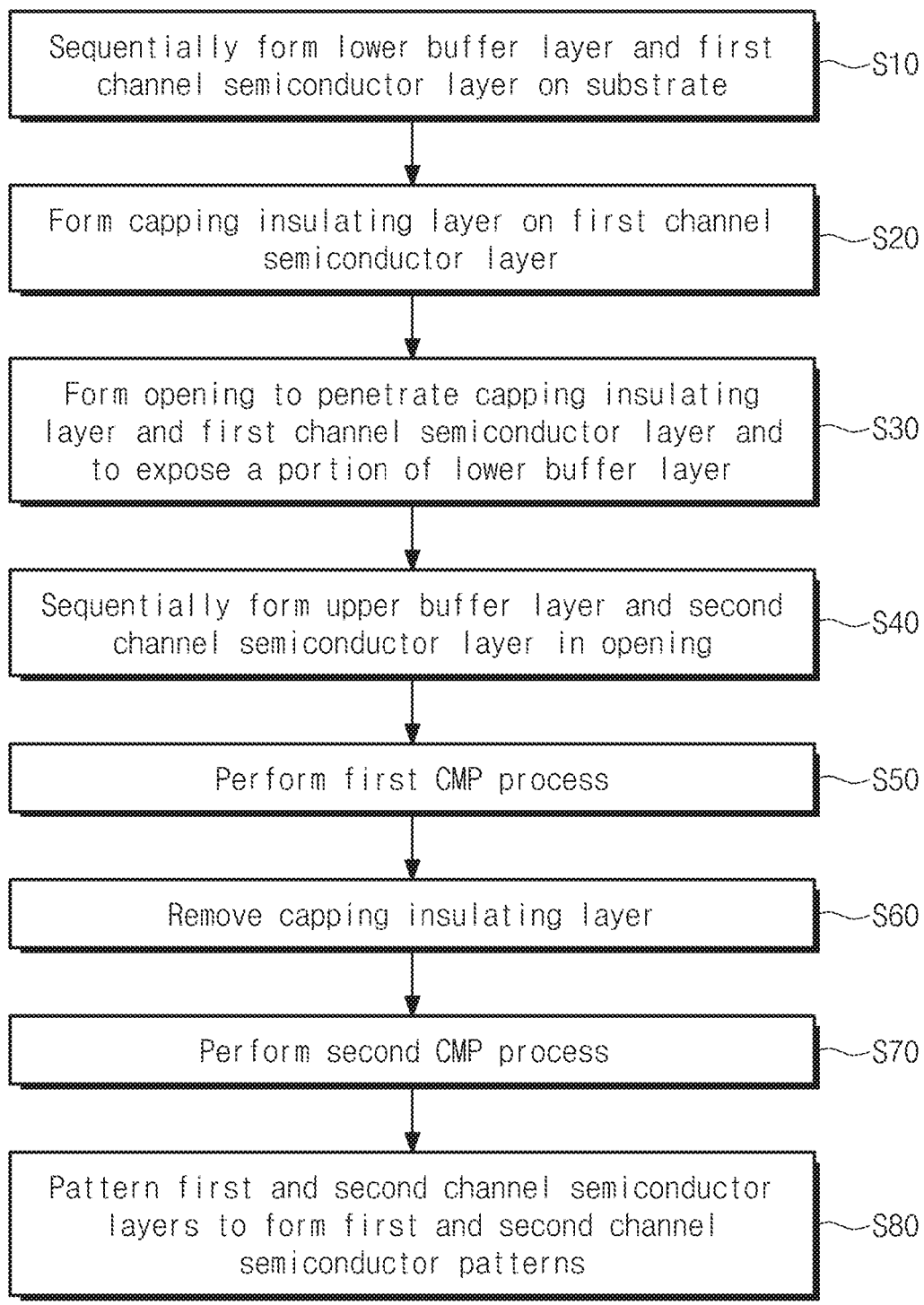

FIG. 1 is a flow chart illustrating a patterning method according to an example embodiment of the inventive concepts.

FIGS. 2 to 8 are sectional views illustrating a patterning method according to an example embodiment of the inventive concepts.

Figure 9:
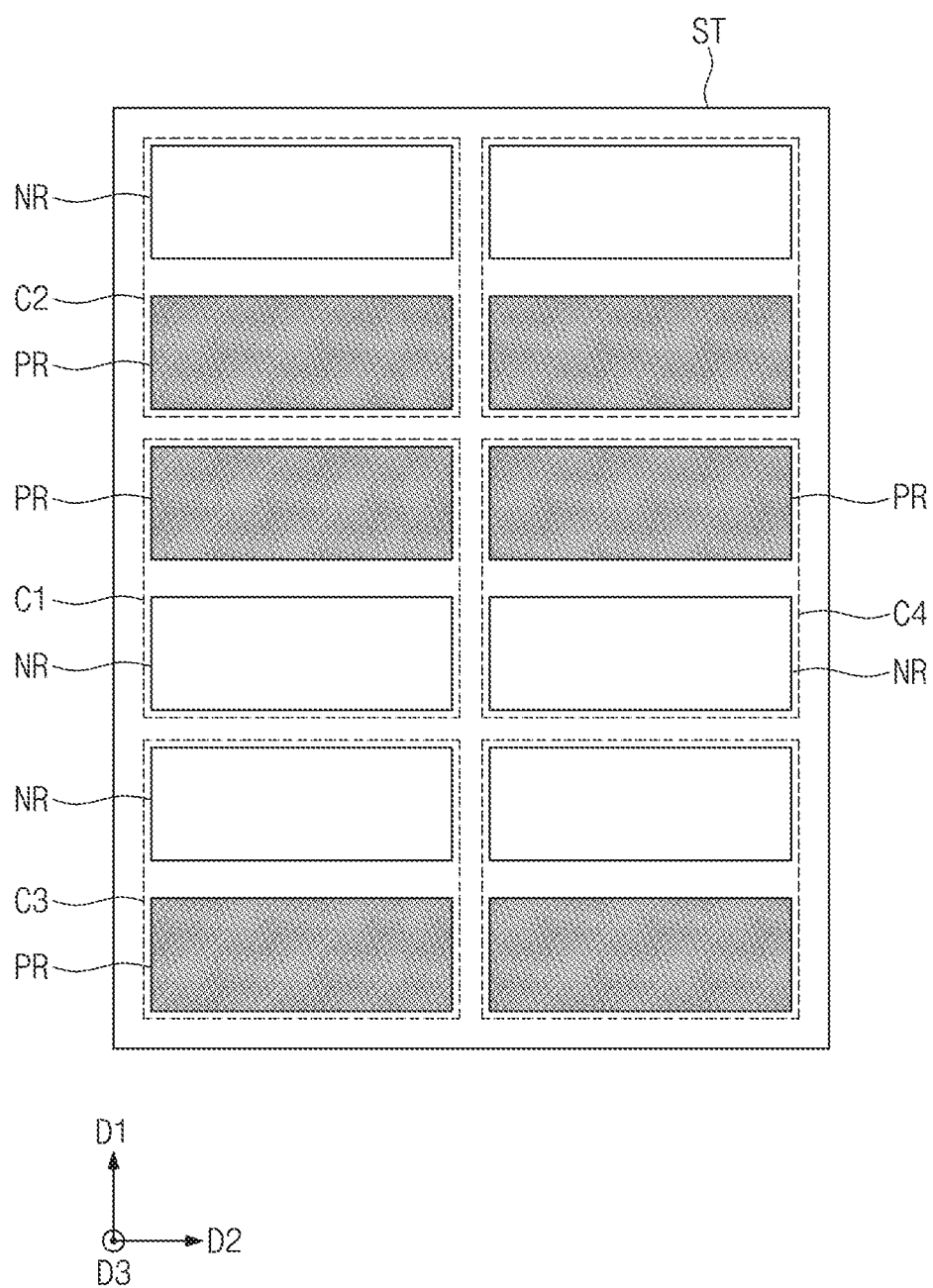

FIG. 9 is a plan view illustrating a semiconductor device according to an example embodiment of the inventive concepts.

Figure 10:
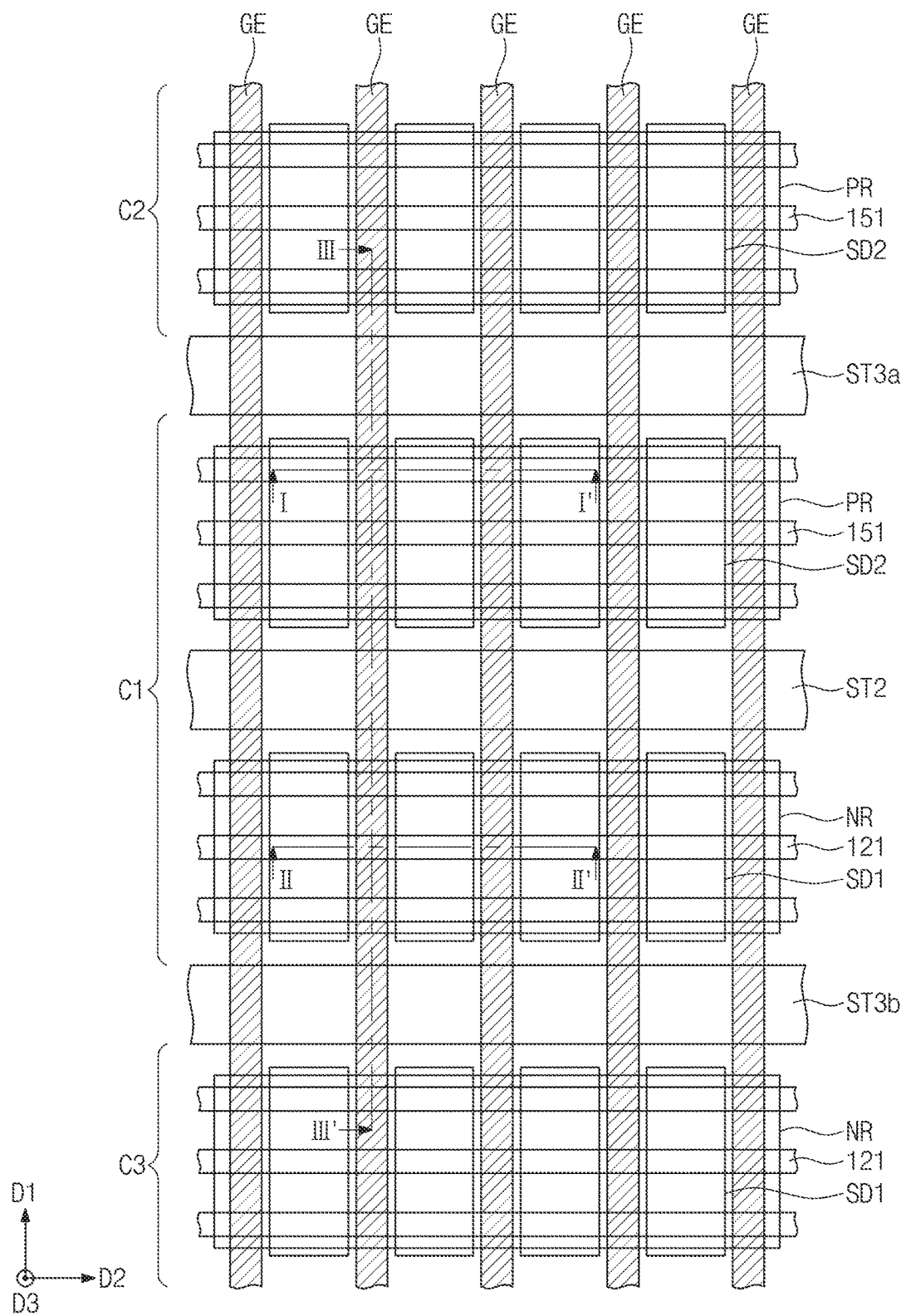
Figure 13A:
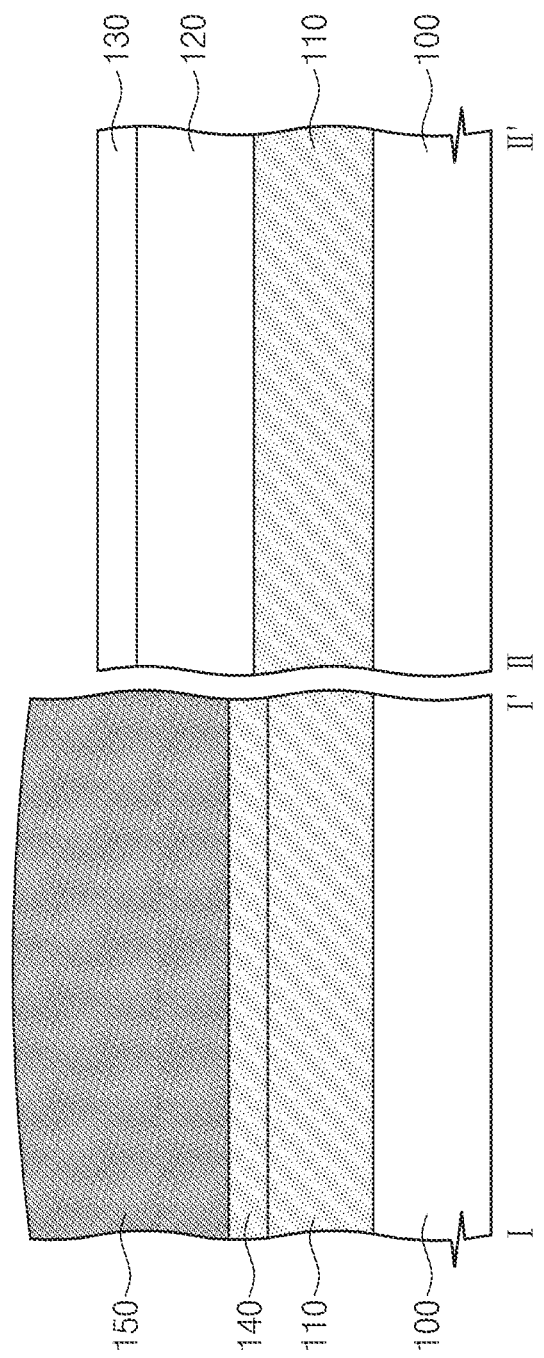
Figure 13B:
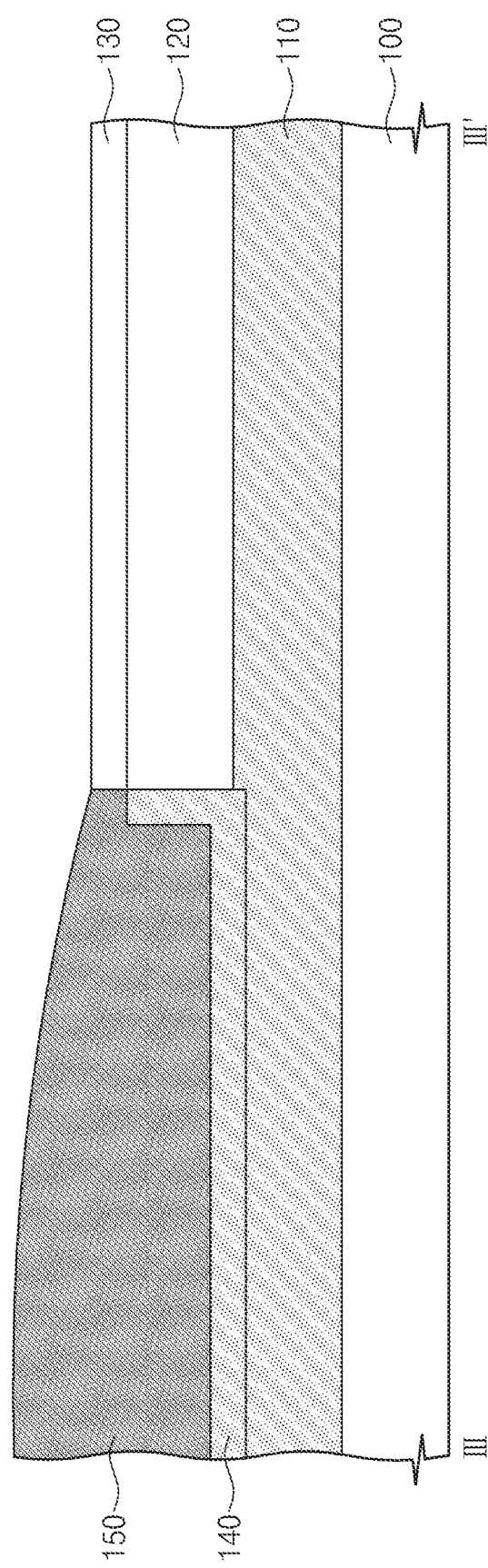
Figure 16A:
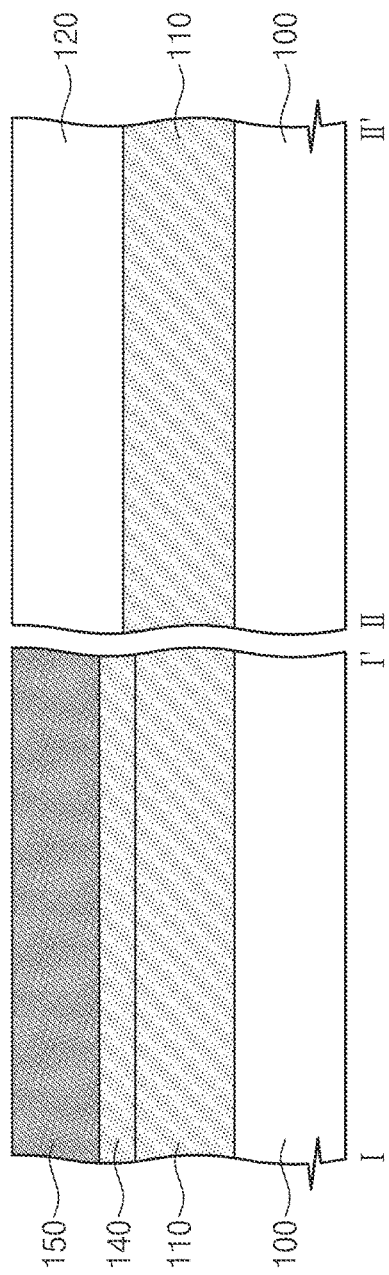
Figure 16B:
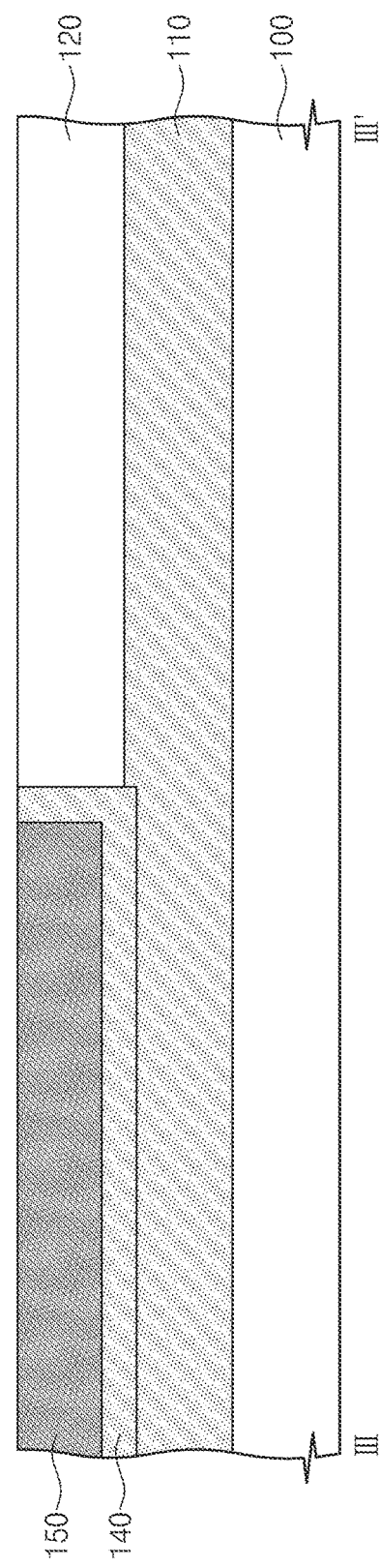
Figure 18A:
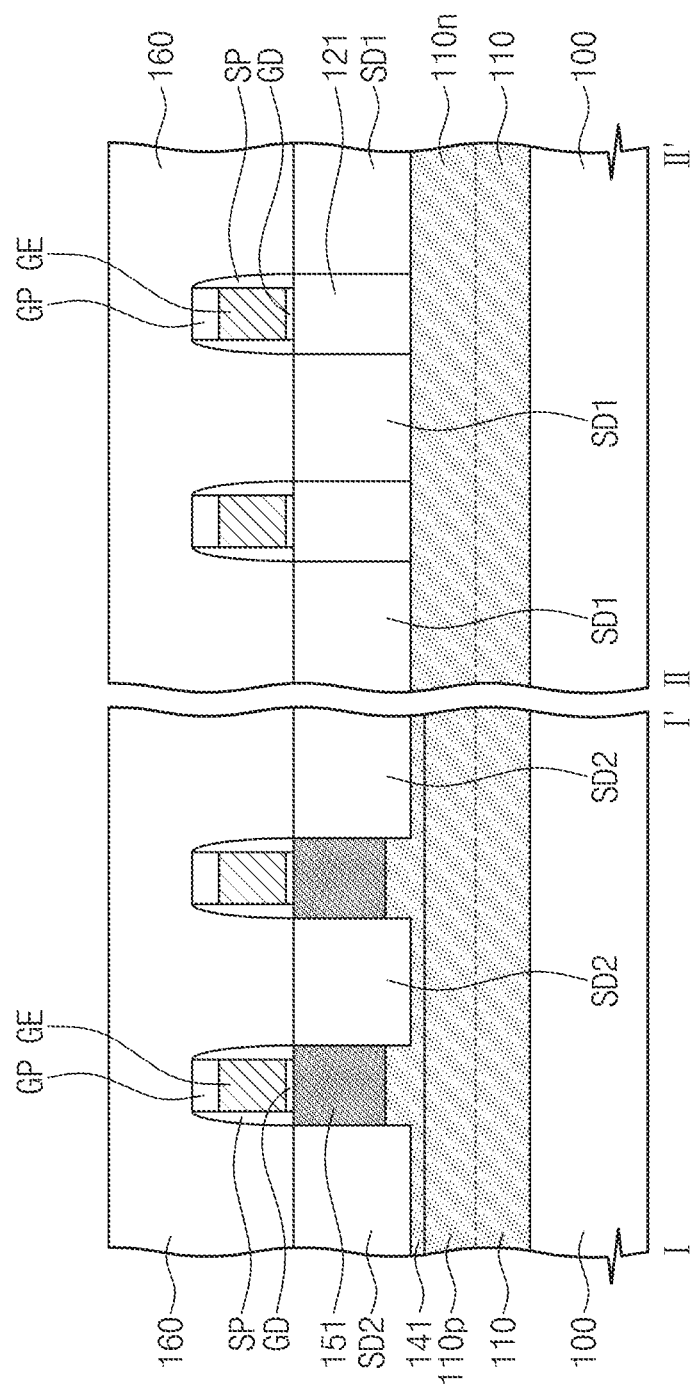
Figure 18B:
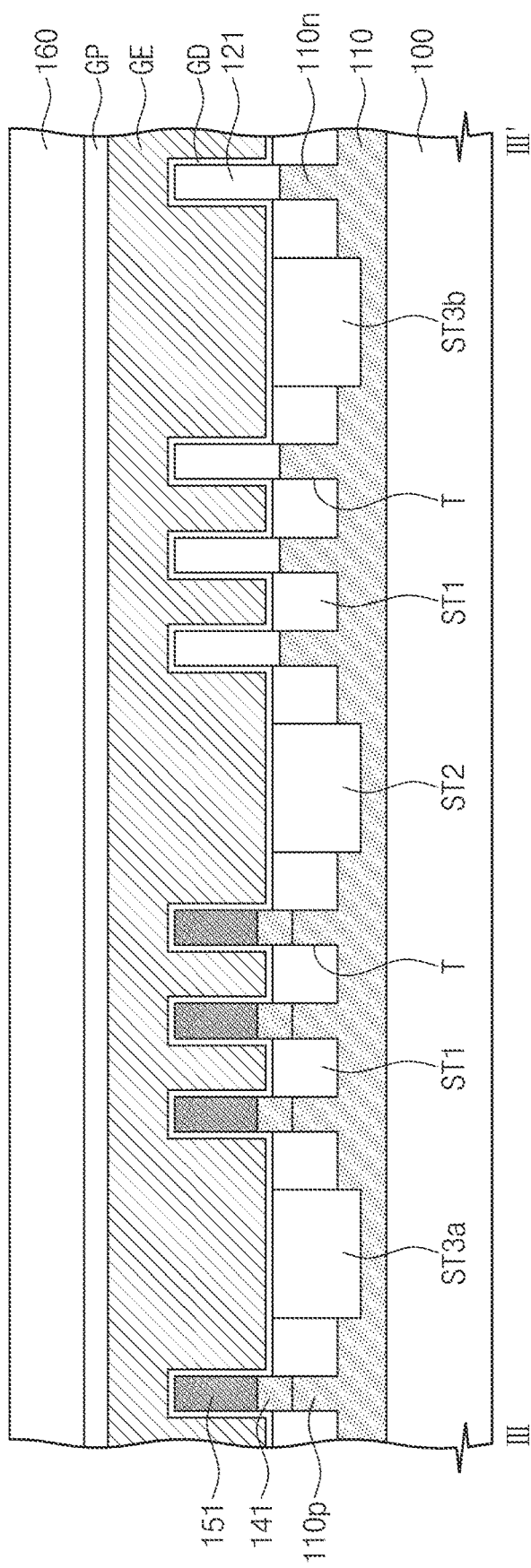

FIG. 10 is a plan view illustrating a portion of logic cells of FIG. 9.

FIGS. 11A to 19A are sectional views, each of which is taken along lines 14' and II-II' of FIG. 10 and is provided to illustrate a method of fabricating a semiconductor device according to an example embodiment of the inventive concepts.

FIGS. 11B to 19B are sectional views, each of which is taken along line III-III' of FIG. 10.

DETAILED DESCRIPTION

Below, some example embodiments of inventive concepts will now be described more fully so that those skilled in the art can easily comprehend the inventive concepts.

FIG. 1 is a flow chart illustrating a patterning method according to an example embodiment of the inventive concepts. FIGS. 2 to 8 are sectional views illustrating a patterning method according to an example embodiment of the inventive concepts.

Figure 2:
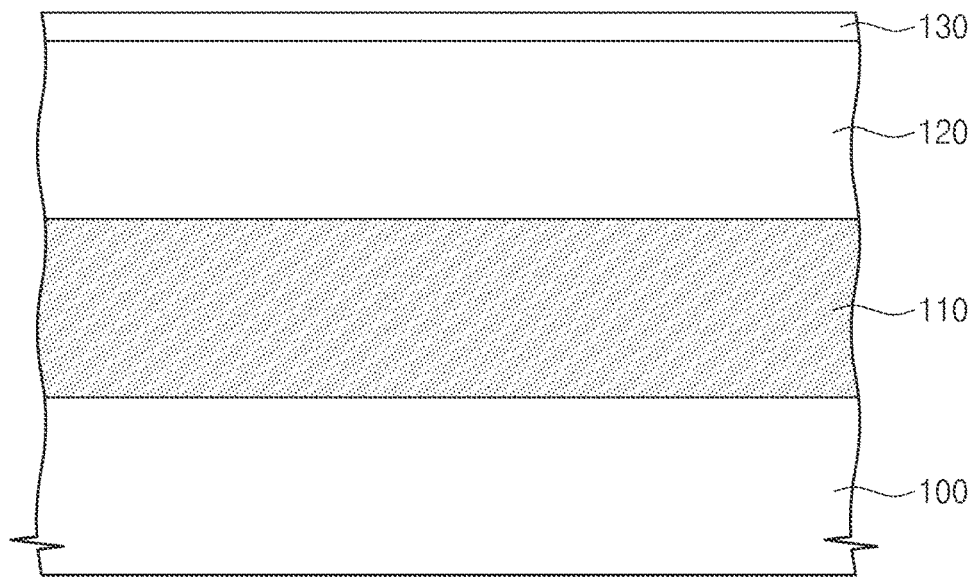

Referring to FIGS. 1 and 2, a lower buffer layer 110 and a first channel semiconductor layer 120 may be formed, for example sequentially formed on a substrate 100 (in S10). The substrate 100 may be a semiconductor substrate. As an example, the substrate 100 may be a silicon wafer. In certain embodiments, the substrate 100 may be a silicon-on-insulator (SOI) wafer, a germanium wafer, a germanium-on-insulator wafer, a silicon-germanium substrate, or a substrate with an epitaxial layer formed by a selective epitaxial growth (SEG) process alternatively, the substrate 100 may be a semiconductor substrate that is formed of or include III-V compound.

The lower buffer layer 110 may be formed of or include a material whose lattice constant is different from that of the substrate 100. For example, the lower buffer layer 110 may be formed of or include at least one of Si, Ge, SiGe, or III-V compounds. The compounds may be or include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

In some example embodiments, the lower buffer layer 110 may be formed by an epitaxial growth process using the substrate 100 as a seed layer. Here, the epitaxial growth process may include solid phase epitaxy (SPE), vapor phase epitaxy (VIDE), and liquid phase epitaxy (LPE) processes. The VPE process may be performed using, for example, at least one of chemical vapor deposition (CVD), reduced pressure CAD (RPCVD), ultra-high vacuum chemical vapor deposition (UHCVD), or molecular beam epitaxy (MBE) methods.

The first channel semiconductor layer 120 may be formed of or include a material having the same lattice structure as the lower buffer layer 110 but having a lower lattice constant than the lower buffer layer 110. In this case, the lower buffer layer 110 may be used to exert a tensile strain to the first channel semiconductor layer 120. As an example, the lower buffer layer 110 may be formed of or include $Si_{1-x}Ge_x$, and the first channel semiconductor layer 120 may be formed of or include Si. As another example, the lower buffer layer 110 may be formed of or include $In_{1-x}Ga_xAs$, and the first channel semiconductor layer 120 may be formed of or include $In_{1-y}Ga_yAs$ where x<y. The first channel semiconductor layer 120 may be formed by the above epitaxial growth process. In other words, the first channel semiconductor layer 120 may be formed by the same method as that for the lower buffer layer 110. In some example embodiments, the lower buffer layer 110 and the first channel semiconductor layer 120 may be formed in situ in the same chamber.

A capping insulating layer 130 may be formed on the first channel semiconductor layer 120 (in S20). As an example, the capping insulating layer 130 may be formed of or include nitride (e.g., silicon nitride or silicon oxynitride). As another example, the capping insulating layer 130 may be formed of or include oxide (e.g., silicon oxide). The capping insulating layer 130 may be formed by a CVD or ALD process.

Figure 3:
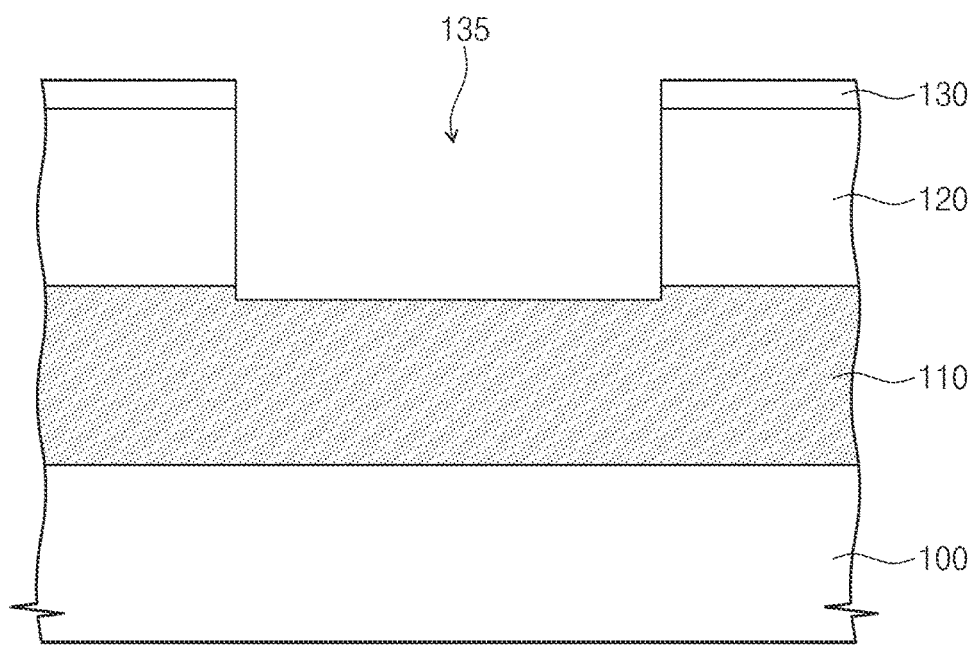

Referring to FIGS. 1 and 3, an opening 135 may be formed to penetrate the capping insulating layer 130 and the first channel semiconductor layer 120 and thereby to expose a portion of the lower buffer layer 110 (in S30).

In some example embodiments, the formation of the opening 135 may include forming a mask pattern (not shown) on the capping insulating layer 130 and performing an anisotropic etching process on the capping insulating layer 130 and the first channel semiconductor layer 120 using the mask pattern as an etch mask. The anisotropic etching process may be performed to expose the lower buffer layer 110, and in certain embodiments, it may be performed in an over-etch manner in such a way that a top surface of the lower buffer layer 110 exposed by the opening 135 may be partially recessed. In other words, the opening 135 may be formed to have a bottom surface that is positioned lower than a bottom surface of the first channel semiconductor layer 120. During the anisotropic etching process, the capping insulating layer 130 may be used as an etch mask. The mask pattern may be removed after the formation of the opening 135.

Figure 4:
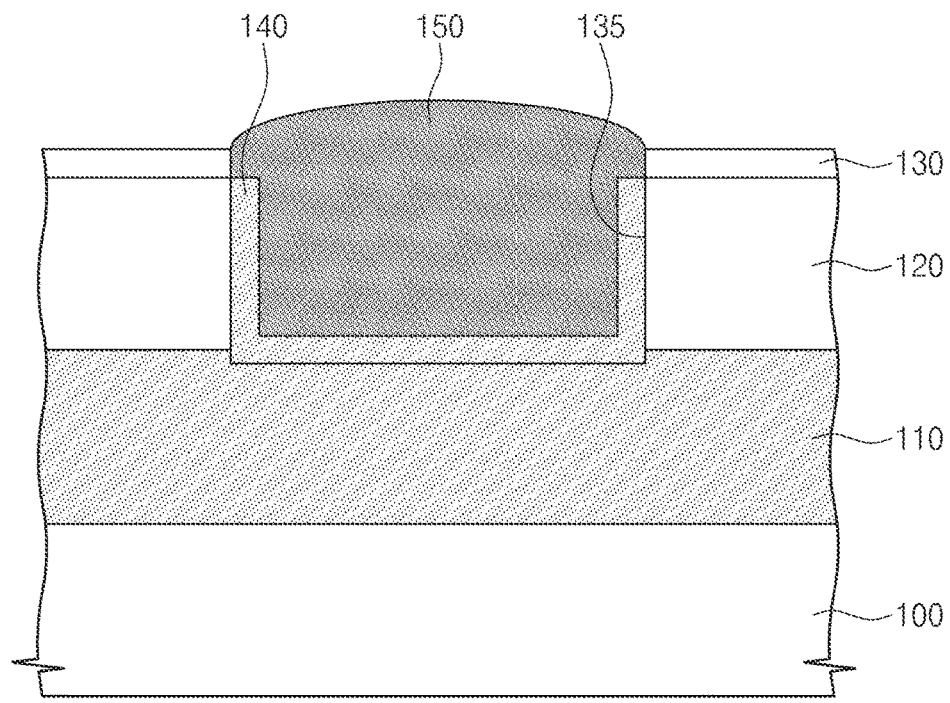

Referring to FIGS. 1 and 4, an upper buffer layer 140 and a second channel semiconductor layer 150 may be formed, for example sequentially formed in the opening 135 (in S40).

In some example embodiments, the upper buffer layer 140 may be formed of or include the same semiconductor material as the lower buffer layer 110. The upper buffer layer 140 may be formed of or include at least one of Si, Ge, SiGe, or III-V compounds. The upper buffer layer 140 may be formed to cover an inner surface of the opening 135 but not to fill the entire of the opening 135. In certain embodiments, the upper buffer layer 140 may be omitted.

The second channel semiconductor layer 150 may be formed of or include a material which has the same lattice structure as, but a larger lattice constant than, the lower or upper buffer layer 110 or 140. In this case, the lower or upper buffer layer 110 or 140 may exert a compressive strain to the second channel semiconductor layer 150. As an example, the lower or upper buffer layer 110 or 140 may be formed of or include $Si_{1-x}Ge_x$, and the second channel semiconductor layer 150 may be formed of or include Ge. As another example, the lower or upper buffer layer 110 or 140 may be formed of or include $Si_{1-z}Ge_z$, and the second channel semiconductor layer 150 may be formed of or include $Si_{1-w}Ge_w$ where z<w. As still other example, the lower or upper buffer layer 110 or 140 may be formed of or include $In_{1-z}Ga_zAs$, and the second channel semiconductor layer 150 may be formed of or include $In_{1-w}Ga_wAs$ where z>w. In the case where the upper buffer layer 140 is provided between the first and second channel semiconductor layers 120 and 150, it is possible to reduce a difference in lattice constant between the first and second channel semiconductor layers 120 and 150 and thereby to suppress occurrence of lattice defects in the second channel semiconductor layer 150. The second channel semiconductor layer 150 may be formed to fill the remaining space of the opening 135 provided with the upper buffer layer 140.

In some example embodiments, the upper buffer layer 140 and the second channel semiconductor layer 150 may be formed by a selective epitaxial growth (SEG) process using the lower buffer layer 110 and/or the first channel semiconductor layer 120 exposed by the opening 135 as a seed layer. Here, the selective epitaxial growth process may include solid phase epitaxy (SPE), vapor phase epitaxy (VPE), and liquid phase epitaxy (LPE) processes. The VPE process may be performed using, for example, at least one of chemical vapor deposition (CVD), reduced pressure CVD (RPCVD), ultra-high vacuum chemical vapor deposition (UHCVD), or molecular beam epitaxy (MBE) methods. During the selective epitaxial growth process, the second channel semiconductor layer 150 may be over-grown to have a portion protruding upwardly with respect to a top surface of the capping insulating layer 130. The protruding portion of the second channel semiconductor layer 150 may have an upwardly convex top surface (i.e., protruding in a direction away from the substrate 100). In some example embodiments, the upper buffer layer 140 and the second channel semiconductor layer 150 may be formed in situ in the same chamber.

In certain embodiments, the upper buffer layer 140 may be formed of or include an insulating material (e.g., silicon nitride or silicon oxide). In this case, unlike that illustrated in FIG. 4, the upper buffer layer 140 may be formed to cover a side surface of the first channel semiconductor layer 120 exposed by the opening 135 and to expose a top surface of the lower buffer layer 110; that is, the upper buffer layer 140 may have a spacer shape. Also, the second channel semiconductor layer 150 may be formed by a selective epitaxial growth process using the lower buffer layer 110 as a seed layer.

Figure 5:
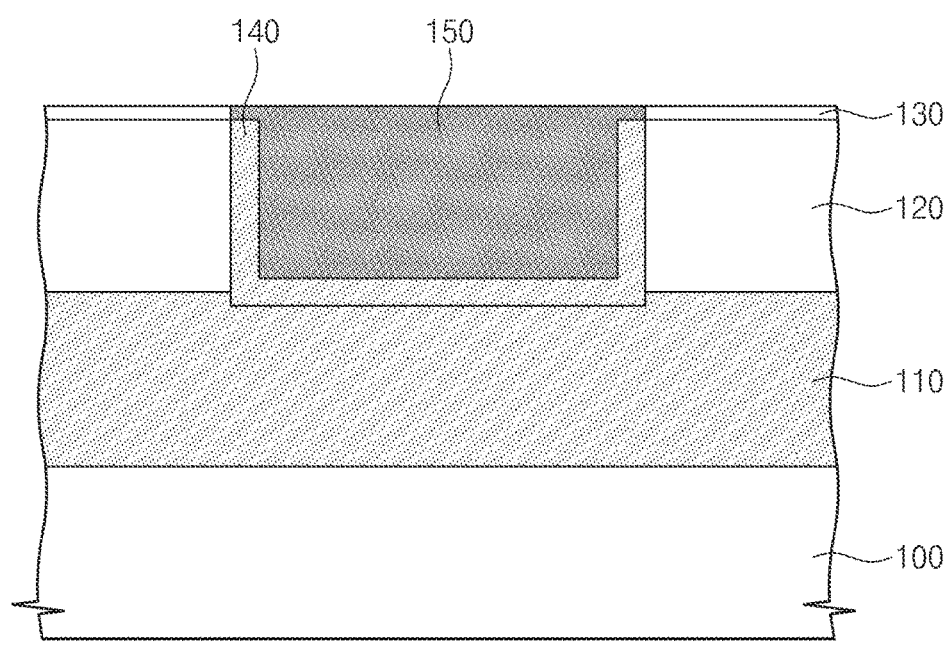

Referring to FIGS. 1 and 5, a first chemical mechanical polishing (CMP) process may be performed to polish a top surface of the second channel semiconductor layer 150 (in S50). In other words, at least a portion of the protruding portion of the second channel semiconductor layer 150 may be removed by the first CMP process. For example, the first CMP process may be performed in such a way that the second channel semiconductor layer 150 has a top surface coplanar with that of the capping insulating layer 130. As a result, the second channel semiconductor layer 150 may have a flat top surface that is positioned at substantially the same level as that of the capping insulating layer 130. In certain embodiments, the capping insulating layer 130 may be partially removed during the first CMP process.

According to some example embodiments of the inventive concepts, the first CMP process may be performed using a process condition, allowing the second channel semiconductor layer 150 to have a high polishing selectivity with respect to the capping insulating layer 130. For example, the first CMP process may be performed using a slurry (hereinafter, a first CMP slurry) capable of polishing a semiconductor material (e.g., Ge or SiGe) of the second channel semiconductor layer 150 at a high polishing rate and of polishing an insulating material (e.g., SiN or $SiO_2$) of the capping insulating layer 130 at a low polishing rate.

In some example embodiments, the first CMP slurry may be provided in the form of an acidic or basic solution containing a first polishing particle, a first oxidizing agent, a first pH regulator, and a polishing regulator.

The first polishing particle may include at least one of silica ($SiO_2$), ceria ($CeO_2$), or alumina ($Al_2O_3$). For example, the first polishing particle may include colloidal silica. In the case where the colloidal silica is used to polish a target layer (e.g., the second channel semiconductor layer 150), it is possible to reduce occurrence of defects in the target layer and to obtain improved flatness of the target layer after the polishing process. For example, the first polishing particle may have a particle size of about 30-80 nm.

The first oxidizing agent may be used to oxidize a semiconductor material in the second channel semiconductor layer 150, and thus, the use of the first oxidizing agent may allow the second channel semiconductor layer 150 to be polished at a higher polishing rate. The first oxidizing agent may include at least one or both of inorganic and organic acid materials. For example, the first oxidizing agent may include at least one of superoxide, dioxygenyl, ozone, ozonide, chlorite, chlorate, perchlorate, halogen compounds, nitric acid, nitrate, hypochlorite, hypohalite, or peroxide. In some example embodiments, the first oxidizing agent may include hydrogen peroxide.

The first pH regulator may be used to adjust pH value of the first CMP slurry. In the case where the first CMP slurry is an acidic solution, it has pH of about 3-5. In the case where the first CMP slurry is a basic solution, it has pH of about 8-10. For example, the first pH regulator may be at least one of acetic acid, formic acid, carboxylic acid, nitric acid, sulfuric acid, hydrochloric acid, or sulfonic acid or at least one of potassium hydroxide, sodium hydroxide, ammonia solution, tetramethyl ammonium hydroxide, tetraethyl ammonium hydroxide, or tetrabutyl ammonium hydroxide. But the inventive concepts may not be limited thereto.

The polishing regulator may be used to increase polishing selectivity of the first CMP slurry. For example, the polishing regulator may be prepared to allow the first CMP slurry to have a high polishing rate to a semiconductor material (e.g., germanium or silicon germanium) and have a very low polishing rate to an insulating material (e.g., silicon oxide or silicon nitride). In some example embodiments, the polishing regulator may include at least one of polymer materials (e.g., pyrrolidone-based polymers, glycol-based polymers, oxide-based polymers, or acrylate-based polymers). As an example, in the case where the capping insulating layer 130 includes silicon nitride and the second channel semiconductor layer 150 includes germanium or silicon germanium, the polishing regulator may be formed of or include poly acrylic acid (PAA). As another example, in the case where the capping insulating layer 130 includes silicon oxide and the second channel semiconductor layer 150 includes germanium or silicon germanium, the polishing regulator may be formed of or include poly ethylene oxide (PEO).

In the case where the first CMP slurry is prepared to have the above features, during the first CMP process, the second channel semiconductor layer 150 may be polished with a high polishing selectivity with respect to the capping insulating layer 130. In other words, during the first CMP process, a polishing or CMP removal rate (hereinafter, a first polishing rate) of the second channel semiconductor layer 150 may be higher than the removal rate (hereinafter, a second polishing rate) of the capping insulating layer 130. For example, during the first CMP process, the polishing selectivity of the second channel semiconductor layer 150 to the capping insulating layer 130 may range from 40:1 to 100:1. In other words, the first polishing rate of the second channel semiconductor layer 150 may range from 700 to 1300 Å/min, and the second polishing rate of the capping insulating layer 130 may range from 10 to 30 Å/min. In sum, in the case where the first CMP slurry is used in the first CMP process for polishing the second channel semiconductor layer 150, it is possible to effectively planarize the top surface of the second channel semiconductor layer 150.

Figure 6:
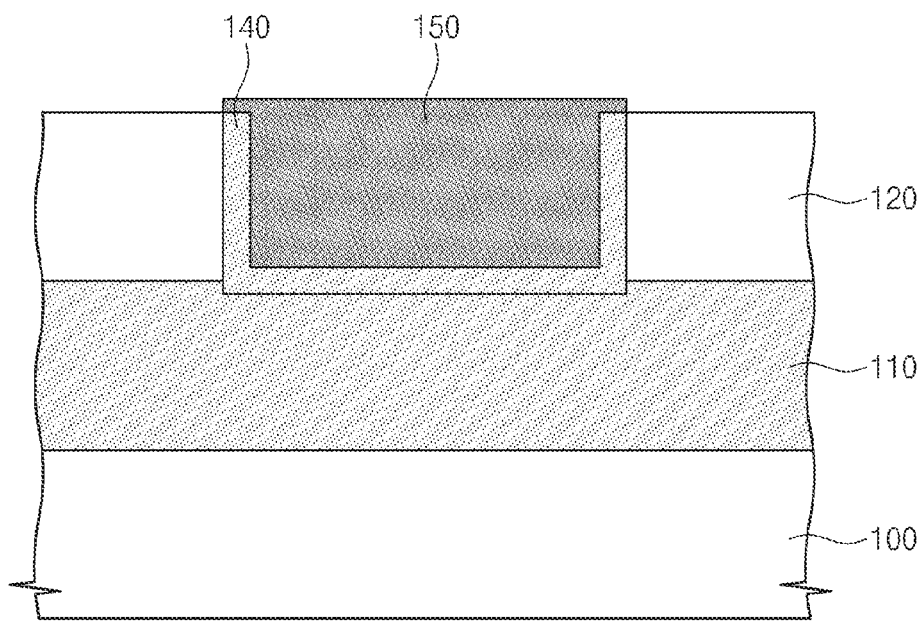

Referring to FIGS. 1 and 6, the capping insulating layer 130 may be removed to expose the top surface of the first channel semiconductor layer 120 (in S60). The removal of the capping insulating layer 130 may be performed using a wet and/or dry etching process. Thus, the top surfaces of the first and second channel semiconductor layers 120 and 150 may have a height difference corresponding to a thickness of the capping insulating layer 130. In other words, the top surface of the second channel semiconductor layer 150 may be positioned at a higher level than the level of the first channel semiconductor layer 120.

Figure 7:
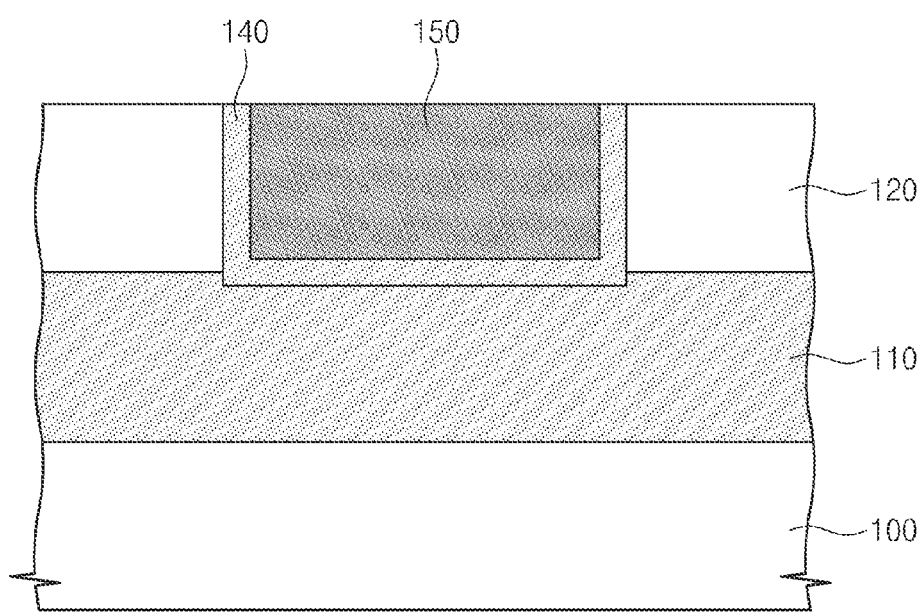

Referring to FIGS. 1 and 7, a second CMP process may be performed to polish the top surface of the second channel semiconductor layer 150 (in S70). For example, the second CMP process may be performed to remove at least a portion of the second channel semiconductor layer 150 that is positioned on the top surface of the first channel semiconductor layer 120. The second CMP process may be performed until the top surface of the second channel semiconductor layer 150 has substantially the same height as the top surface of the first channel semiconductor layer 120. Accordingly, the first and second channel semiconductor layers 120 and 150 may have top surfaces coplanar with each other. But the inventive concepts may not be limited thereto. Unlike that shown in FIG. 7, the second channel semiconductor layer 150 may be formed to have a top surface that is higher or lower than the top surface of the first channel semiconductor layer 120.

In some example embodiments, the second CMP process may be performed to polish the second channel semiconductor layer 150 at a low polishing selectivity with respect to the first channel semiconductor layer 120. For example, the second CMP process may be performed to have a polishing selectivity of 1:1 to 2:1 for the second channel semiconductor layer 150 and the first channel semiconductor layer 120. Here, in the second CMP process, the second channel semiconductor layer 150 may have a third polishing rate that is lower than the first polishing rate in the first CMP process, but the third polishing rate may be higher than or substantially equal to a fourth polishing rate of the first channel semiconductor layer 120 in the second. CMP process. For example, in the second CMP process, the third polishing rate of the second channel semiconductor layer 150 may range from 200 to 420 Å/min, and the fourth polishing rate of the first channel semiconductor layer 120 may range from 200 to 210 Å/min.

The polishing selectivity and the polishing rate described above may be achieved by performing the second CMP process under a process condition, allowing the second channel semiconductor layer 150 to have a low polishing selectivity with respect to the first channel semiconductor layer 120. For example, the second CMP process may be performed using a slurry (hereinafter, a second CMP slurry) capable of polishing not only a semiconductor material (e.g., Si) of the first channel semiconductor layer 120 but also a semiconductor material (e.g., Ge or SiGe) of the second channel semiconductor layer 150 at a low polishing rate.

In some example embodiments, the second CMP slurry may be provided in the form of an acidic solution containing a second polishing particle, a second oxidizing agent, and a second pH regulator. The second polishing particle may include the same material as the first polishing particle of the first CMP slurry. For example, the second polishing particle may include at least one of ceria ($CeO_2$) or alumina ($Al_2O_3$). In certain embodiments, the second polishing particle may further include colloidal silica. The second polishing particle may have a particle size of about 30-80 nm.

The second oxidizing agent may include at least one of superoxide, dioxygenyl, ozone, ozonide, chlorite, chlorate, perchlorate, halogen compounds, nitric acid, nitrate, hypochlorite, hypohalite, or peroxide. The second oxidizing agent may be selected to contain a material that is the same as or different from the first oxidizing agent of the first CMP slurry. For example, the first oxidizing agent may include hydrogen peroxide, and the second oxidizing agent may include at least one of hydrogen peroxide, sodium chlorate, ferric nitrate, potassium nitrate, or ammonium nitrate. The second oxidizing agent may be used to oxidize the semiconductor materials constituting the first and second channel semiconductor layers 120 and 150, and this may make it possible to increase polishing rates of the first and second channel semiconductor layers 120 and 150.

The second CMP slurry may have pH value of about 4.5-5.5. The second pH regulator may be used to adjust the pH value of the second CMP slurry. The second pH regulator may include at least one of acetic acid, formic acid, carboxylic acid, nitric acid, sulfuric acid, hydrochloric acid, or sulfonic acid. In some example embodiments, the pH value of the second CMP slurry may be adjusted to control a polishing selectivity of the second channel semiconductor layer 150 with respect to the first channel semiconductor layer 120. For example, in the case where the pH value of the second CMP slurry is less than 4.5, the polishing selectivity of the second channel semiconductor layer 150 with respect to the first channel semiconductor layer 120 may be less than 1:1. By contrast, in the case where the pH value of the second CMP slurry is greater than 5.5, the polishing selectivity of the second channel semiconductor layer 150 with respect to the first channel semiconductor layer 120 may be higher than 2:1.

If the second channel semiconductor layer 150 is polished by the first CMP process, due to the high polishing rate in the first CMP process, a surface damage (e.g., scratch) may be formed on the polished top surface of the second channel semiconductor layer 150. In the case where the second channel semiconductor layer 150 is used as a channel region of a transistor, the occurrence of the surface damage may lead to deterioration or increased variation in electric characteristics of the transistor. By contrast, according to some example embodiments of the inventive concepts, the second CMP slurry may be used to polish the second channel semiconductor layer 150, and thus, it is possible to cure the surface damage of the second channel semiconductor layer 150, which may be caused by the first CMP process, and moreover, to reduce or prevent the surface of the second channel semiconductor layer 150 from being damaged during the second CMP process. Furthermore, surface roughness of the second channel semiconductor layer 150 may be better after the second CMP process than after the first CMP process. For example, surface roughness Rq of the second channel semiconductor layer 150 may be about 8 Å or higher after the first CMP process and about 6 Å or less after the second CMP process. Similarly, it is possible to reduce or prevent or suppress the surface of the first channel semiconductor layer 120 from being damaged during the second CMP process and to allow the first channel semiconductor layer 120 after the second CMP process to have good surface roughness of 6 Å or less. As a result, it is possible to improve electric characteristics and reliability of a semiconductor device including the first and second channel semiconductor layers 120 and 150.

Figure 8:
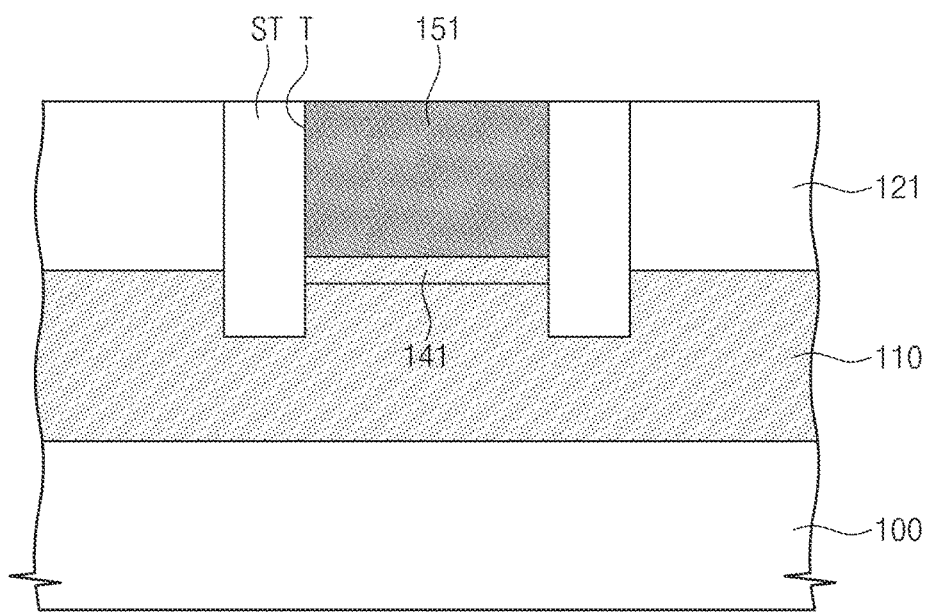

Referring to FIGS. 1 and 8, the first channel semiconductor layer 120 may be patterned to form a first channel semiconductor pattern 121, and the second channel semiconductor layer 150 may be patterned to form a second channel semiconductor pattern 151 (in S80).

The formation of the first and second channel semiconductor patterns 121 and 151 may include forming a mask pattern (not shown) on the first and second channel semiconductor layers 120 and 150 and performing an anisotropic etching process using the mask pattern as an etch mask to form trenches T defining the first and second channel semiconductor patterns 121 and 151. During the formation of the trenches T, the upper buffer layer 140 may also be patterned to form an upper buffer pattern 141. In addition, an upper portion of the lower buffer layer 110 may also be etched during the formation of the trenches T.

A device isolation layer ST may be formed by filling the trenches T with an insulating material (e.g., silicon oxide). In other words, the device isolation layer ST may be formed between the first channel semiconductor pattern 121 and the second channel semiconductor pattern 151. Although the device isolation layer ST is illustrated to have a top surface substantially coplanar with those of the first and second channel semiconductor patterns 121 and 151, some example embodiments of the inventive concepts may not be limited thereto. For example, the device isolation layer ST may be formed to expose upper portions or upper side surfaces of the first and second channel semiconductor patterns 121 and 151. In this case, each or at least one of the first and second channel semiconductor patterns 121 and 151 may have a fin-shaped structure.

Although not shown, a first transistor e.g., PMOS transistor) may be formed on the first channel semiconductor pattern 121, and a second transistor (e.g., NMOS transistor), whose type is different from that of the first transistor, may be formed on the second channel semiconductor pattern 151. Here, a portion of the first channel semiconductor pattern 121 may be used as a channel region of the first transistor, and a portion of the second channel semiconductor pattern 151 may be used as a channel region of the second transistor. As a result, mobility of majority carriers in each or at least one of the channel regions can be increased, and this may make it possible to improve electric characteristics of the semiconductor device.

Hereinafter, an example of a semiconductor device with the first and second channel semiconductor patterns will be described with reference to a plan view of FIG. 9.

Referring to FIG. 9, a semiconductor device may include a plurality of logic cells integrated on a substrate. As an example, the logic cells may include a first logic cell C1, second and third logic cells C2 and C3, which are spaced apart from each other in a first direction D1 with the first logic cell C1 interposed therebetween, and a fourth logic cell C4, which is provided beside the first logic cell C1 in a second direction D2 crossing the first direction D1. Although six logic cells are illustrated in FIG. 9, the inventive concepts are not limited thereto.

Each or at least one of the logic cells may include a PMOSFET region PR and an NMOSFET region NR. For example, the PMOSFET and NMOSFET regions PR and NR may be spaced apart from each other in the first direction D1, and the device isolation layer ST may be interposed between the PMOSFET and NMOSFET regions PR and NR. In addition, the PMOSFET region PR of the first logic cell C1 may be adjacent to the PMOSFET region PR of the second logic cell C2, and the NMOSFET region NR of the first logic cell C1 may be adjacent to the NMOSFET region NR of the third logic cell C3.

In some example embodiments, the second channel semiconductor patterns 151 described with reference to FIG. 8 may be provided on the PMOSFET region PR, and the first channel semiconductor patterns 121 described with reference to FIG. 8 may be provided on the NMOSFET region NR.

A PMOS transistor may be formed on the PMOSFET region PR. Here, a portion of the second channel semiconductor pattern 151 may be used as a channel region of the PMOS transistor. This may make it possible to increase mobility of the majority carriers (e.g., holes) in the channel region of the PMOS transistor. An NMOS transistor array be formed on the NMOSFET region NR. Here, a portion of the first channel semiconductor pattern 121 may be used as a channel region of the NMOS transistor. This may make it possible to increase mobility of the majority carriers (e.g., electrons) in the channel region of the NMOS transistor. As a result, both NMOS and PMOS transistors of the semiconductor device may have improved electric characteristics (e.g., mobility). In some example embodiments, the transistors may have a planar transistor structure. In certain embodiments, the transistors may have a Fin-FET structure.

In some example embodiments, the term "logic cell" may refer to a unit circuit configured to perform a single logical operation. For example, in each or at least one of the logic cells, the transistors may be used as a part of a logic circuit for realizing a Boolean logic function (e.g., INVERTER, AND, OR, NAND, NOR, and so forth) or a storage function (e.g., FLIP-FLOP).

Hereinafter, a method of fabricating a semiconductor device according to some example embodiments of the inventive concepts will be described with reference to FIGS.

9, 10, 11A to 19A, and 11B to 19B. In detail, FIG. 10 is a plan view illustrating a portion of logic cells of FIG. 9. FIGS. 11A to 19A are sectional views, each of which is taken along lines I-I' and II-II' of FIG. 10 and is provided to illustrate a method of fabricating a semiconductor device according to an example embodiment of the inventive concepts. FIGS. 11B to 19B are sectional views, each of which is taken along line of FIG. 10.

Referring to FIGS. 9, 10, 11A, and 11B, a substrate 100 may be provided. The substrate 100 may be configured to have substantially the same features as the semiconductor substrate described with reference to FIGS. 1 and 2. For example, the substrate 100 may be a silicon wafer. The substrate 100 may include a plurality of logic cell regions. Each or at least one of the logic cell regions may correspond to the region with the logic cells, which has been described with reference to FIG. 9. For example, the logic cell regions may include first to third logic cell regions, on which first to third logic cells C1, C2, and C3 are respectively formed. Each or at least one of the logic cell regions may include a PMOSFET region PR and an NMOSFET region NR. For concise description, the following description will refer to the first to third logic cell regions, but the method of fabricating a semiconductor device, according to some example embodiments of the inventive concepts, is applicable to the others of the logic cell regions.

A lower buffer layer 110, a first channel semiconductor layer 120, and a capping insulating layer 130 may be formed, for example sequentially formed on the substrate 100. In other words, each or at least one of the lower buffer layer 110, the first channel semiconductor layer 120, and the capping insulating layer 130 may be formed to cover all the first to third logic cell regions of the substrate 100. Each or at least one of the lower buffer layer 110, the first channel semiconductor layer 120, and the capping insulating layer 130 may be formed by the same method (or of the same material) as that described with reference to FIGS. 1 and 2. For example, at least one of the lower buffer layer 110 and the first channel semiconductor layer 120 may be formed by an epitaxial growth process, and in some example embodiments, the lower buffer layer 110 and the first channel semiconductor layer 120 may be respectively formed of or include $Si_{1-x}Ge_x$ and Si. The capping insulating layer 130 may include a silicon nitride layer or a silicon oxide layer which may be formed by a CVD process.

Referring to FIGS. 9, 10, 12A, and 12B, the capping insulating layer 130 and the first channel semiconductor layer 120 may be partially removed to form an opening 135 exposing the lower buffer layer 110 of the PMOSFET region PR. For example, the opening 135 may be formed to have a trench-shaped structure extending in a second direction D2 and to expose the lower buffer layer 110 on the PMOSFET regions PR of the first and second logic cell regions.

In some example embodiments, the formation of the opening 135 (i.e., the partial removal of the capping insulating layer 130 and the first channel semiconductor layer 120) may include forming a mask pattern (not shown) on the capping insulating layer 130 and then performing an anisotropic etching process using the mask pattern as an etch mask. The anisotropic etching process may be performed to expose the lower buffer layer 110, and in certain embodiments, it may be performed in an over-etch manner in such a way that a top surface of the lower buffer layer 110 exposed by the opening 135 may be partially recessed. In other words, the opening 135 may be formed to have a bottom surface that is positioned lower than the lower surface of the first channel semiconductor layer 120.

Referring to FIGS. 9, 10, 13A, and 13B, an upper buffer layer 140 and a second channel semiconductor layer 150 may be formed, for example sequentially formed in the opening 135.

The upper buffer layer 140 and the second channel semiconductor layer 150 may be formed by the same method (or of the same material) as that described with reference to FIGS. 1 and 4. For example, the upper buffer layer 140 and the second channel semiconductor layer 150 may be formed by a selective epitaxial growth process using the lower buffer layer 110 and/or the first channel semiconductor layer 120 exposed by the opening 135 as a seed layer. Here, the upper buffer layer 140 may be formed of or include the same semiconductor material as the lower buffer layer 110, and the second channel semiconductor layer 150 may be formed of or include a material whose lattice constant is greater than the lattice constant of the lower and upper buffer layers 110 and 140. As an example, the lower buffer layer 110 may be formed of or include $Si_{1-x}Ge_x$, and the second channel semiconductor layer 150 may be formed of or include Ge. As another example, the lower buffer layer 110 may be formed of or include $Si_{1-z}Ge_z$, and the second channel semiconductor layer 150 may be formed of or include $Si_{1-w}Ge_w$, where z<w. During the selective epitaxial growth process, the second channel semiconductor layer 150 may be over-grown to have a portion protruding upwardly with respect to a top surface of the capping insulating layer 130. The protruding portion of the second channel semiconductor layer 150 may have an upwardly convex top surface (i.e., protruding in a direction away from the substrate 100).

Referring to FIGS. 9, 10, 14A, and 14B, a first CMP process may be performed to polish the top surface of the second channel semiconductor layer 150. The first CMP process may be performed in such a way that the second channel semiconductor layer 150 has a top surface coplanar with that of the capping insulating layer 130. As a result, the second channel semiconductor layer 150 may have a flat top surface that is positioned at substantially the same level as that of the capping insulating layer 130. The first CMP process may be performed by the same method as that described with reference to FIGS. 1 and 5. For example, the first CMP process may be performed using the first CMP slurry. In certain embodiments, the capping insulating layer 130 may be partially removed during the first CMP process.

Referring to FIGS. 9, 10, 15A, and 15B, the capping insulating layer 130 may be removed to expose the top surface of the first channel semiconductor layer 120. The removal of the capping insulating layer 130 may be performed using a wet and/or dry etching process. As a result, the second channel semiconductor layer 150 may have a top surface that is positioned at a higher level than the top surface of the first channel semiconductor layer 120.

Referring to FIGS. 9, 10, 16A, and 16B, a second CMP process may be performed to polish the top surface of the second channel semiconductor layer 150. The second CMP process may be performed until the top surface of the second channel semiconductor layer 150 has substantially the same height as that of the first channel semiconductor layer 120. Accordingly, the first and second channel semiconductor layers 120 and 150 may have top surfaces coplanar with each other. But the inventive concepts may not be limited thereto. The second CMP process may be performed by the same method as that described with reference to FIGS. 1 and 7. For example, the second CMP process may be performed using the second CMP slurry. In certain embodiments, the first channel semiconductor layer 120 may be partially removed during the second CMP process.

Referring to FIGS. 9, 10, 17A, and 17B, the first channel semiconductor layer 120 may be patterned to form first channel semiconductor patterns 121, and the second channel semiconductor layer 150 may be patterned to form second channel semiconductor patterns 151. In some example embodiments, the first channel semiconductor patterns 121 may be formed on the NMOSFET region NR of each or at least one of the first to third logic cell regions, and the second channel semiconductor patterns 151 may be formed on the PMOSFET region PR of each or at least one of the first to third logic cell regions.

The first channel semiconductor patterns 121 may be arranged spaced apart from each other in a first direction D1 and may extend in the second direction D2. Similarly, the second channel semiconductor patterns 151 may be arranged spaced apart from each other in the first direction D1 and may extend in the second direction D2. Each or at least one of the first and second channel semiconductor patterns 121 and 151 may be formed to have a fin-shaped structure protruding in a third direction D3 perpendicular to both the first and second directions D1 and D2. It is to be noted that the perpendicular direction includes a variation due to manufacturing tolerances.

In some example embodiments, the formation of the first and second channel semiconductor patterns 121 and 151 may include forming a mask pattern (not shown) on the first and second channel semiconductor layers 120 and 150 and then performing an anisotropic etching process using the mask pattern as an etch mask to form trenches T defining the first and second channel semiconductor patterns 121 and 151. During the formation of the trenches T, the upper buffer layer 140 may be etched to form an upper buffer pattern 141. Also, during the formation of the trenches T, an upper portion of the lower buffer layer 110 may be etched to form lower buffer patterns. The lower buffer patterns may include n-lower buffer patterns 110n formed on the NMOSFET region NR and p-lower buffer patterns 110p formed on the PMOSFET region PR. Hereinafter, the n-lower buffer pattern 110n may be referred to as a 'first buffer pattern', and the p-lower buffer pattern 110p and the upper buffer pattern 141 thereon may be referred to as a 'second buffer pattern'. As shown in FIG. 17B, a top surface of the second buffer pattern (i.e., an interface between the second buffer pattern and the second channel semiconductor pattern 151) may be positioned at a higher level than a top surface of the first buffer pattern (i.e., an interface between the first buffer pattern and the first channel semiconductor pattern 121).

First device isolation layers ST1 may be formed by filling the trenches T with an insulating material (e.g., silicon oxide). The first device isolation layers ST1 may be formed to expose upper portions of the first and second channel semiconductor patterns 121 and 151. In other words, the first and second channel semiconductor patterns 121 and 151 may include protruding portions whose top surfaces are positioned at a higher level than top surfaces of the first device isolation layers ST1. Although the top surfaces of the first device isolation layers ST1 are illustrated to be higher than the top surfaces of the first buffer patterns and lower than the top surfaces of the second buffer patterns, but the inventive concepts are not limited thereto.

A second device isolation layer ST2 and third device isolation layers ST3a and ST3b may be formed on the substrate 100. The second device isolation layer ST2 may be formed to extend in the second direction D2 and to separate the PMOSFET and NMOSFET regions PR and NR of the first logic cell C1 from each other. The third device isolation layer ST3a may be formed to extend in the second direction D2 and to separate an adjacent pair of the first and second logic cells C1 and C2 from each other. The third device isolation layer ST3b may be formed to extend in the second direction D2 and to separate an adjacent pair of the first and third logic cells C1 and C3 from each other. The second and third device isolation layers ST2, ST3a, and ST3b may be formed by a shallow-trench isolation (STI) process. The second and third device isolation layers ST2, ST3a, and ST3b may be formed of or include, for example, silicon oxide. The second and third device isolation layers ST2, ST3a, and ST3b may be formed to be thicker than the first device isolation layers ST1. In some example embodiments, top surfaces of the first, second, and third device isolation layers ST1, ST2, ST3a, and ST3b may be positioned at substantially the same level.

Referring to FIGS. 9, 10, 18A, and 18B, gate structures may be formed on the substrate 100. Each or at least one of the gate structures may include a gate dielectric pattern GD, a gate electrode GE, and a gate capping pattern GP, which are stacked, for example sequentially stacked on the substrate 100. The gate structures may extend in the first direction D1 and may cross both of the first and second channel semiconductor patterns 121 and 151 provided on at least one or all of the first to third logic cell regions.

In some example embodiments, the formation of the gate structures may include forming, for example sequentially forming a gate dielectric layer, a gate electrode layer, and a gate capping layer on the substrate 100 to cover the first and second channel semiconductor patterns 121 and 151, and then performing a patterning process. The gate dielectric layer may be formed of or include at least one of silicon oxide, silicon oxynitride, or high-k dielectric materials having dielectric constants higher than the dielectric constants of silicon oxide. The gate electrode layer may be formed of or include at least one of doped semiconductor, metals, or conductive metal nitrides. The gate capping layer may be formed of or include at least one of silicon oxide, silicon nitride, or silicon oxynitride. Each or at least one of the gate dielectric layer, the gate conductive layer, and the gate capping layer may be formed by a chemical vapor deposition and/or a sputtering process. Thereafter, gate spacers SP may be formed on side surfaces of the gate structures. The formation of the gate spacers SP may include forming a gate spacer layer to cover the gate structures and anisotropically etching the gate spacer layer. The gate spacer layer may be formed of or include at least one of silicon oxide, silicon nitride, or silicon oxynitride.

Source/drain regions may be formed at both sides of gate structures. The source/drain regions may include first source/drain regions SD1, which are formed at both sides of the gate structures on the NMOSFET region NR, and second source/drain regions SD2, which are formed at both sides of the gate structures on the PMOSFET region PR. In some example embodiments, the first source/drain regions SD1 may be formed by injecting n-type impurities into the first channel semiconductor patterns 121 positioned at both sides of the gate structures on the NMOSFET region NR. The second source/drain regions SD2 may be formed by injecting p-type impurities into the second channel semiconductor patterns 151 positioned at both sides of the gate structures on the PMOSFET region PR. In certain embodiments, the p-type impurities injected into the second channel semiconductor patterns 151 may be diffused into the upper buffer patterns 141.

In the NMOSFET region NR, the gate dielectric pattern GD, the gate electrode GE, and the first source/drain regions SD1 may constitute a first transistor or an NMOS transistor.

A portion of the first channel semiconductor patterns 121 positioned below the gate electrode GE and between the first source/drain regions SD1 may be used as a channel region of the first transistor. In this case, a tensile strain may be exerted to the first channel semiconductor patterns 121, and this may make it possible to increase mobility of majority carriers (i.e., electrons) in the channel region of the first transistor.

Similarly, in the PMOSFET region PR, the gate dielectric pattern GD, the gate electrode GE, and the second source/drain regions SD2 may constitute a second transistor or a PMOS transistor. In this case, a portion of the second channel semiconductor patterns 151 positioned below the gate electrode GE and between the second source/drain regions SD2 may be used as a channel region of the second transistor. In this case, a compressive strain may be exerted to the second channel semiconductor patterns 151, and this may make it possible to increase mobility of majority carriers (i.e., holes) in the channel region of the second transistor.

Thereafter, an interlayered insulating layer 160 may be formed on the substrate 100 to cover the gate structures. The interlayered insulating layer 160 may be formed of or include at least one of silicon oxide, silicon nitride, or silicon oxynitride. First contact holes (not shown) may be formed to penetrate the interlayered insulating layer 160 and to expose the source/drain regions SD1 and SD2. During the etching process for forming the first contact holes, upper portions of the source/drain regions SD1 and SD2 may be partially removed. Second contact hole (not shown) may be formed to penetrate the interlayered insulating layer 160 and to expose the gate electrode GE. Thereafter, first and second contact plugs (not shown) may be separately or simultaneously formed to fill the first and second contact holes, respectively interconnection lines (not shown) may be formed on the interlayered insulating layer 160 and may be connected to the first and second contact plugs. Voltages may be applied to source/drain regions SD1 and SD2 and the gate electrode GE through the interconnection lines and the first and second contact plugs. The first and second contact plugs and the interconnection lines may be formed of or include a conductive material.

Figure 19A:
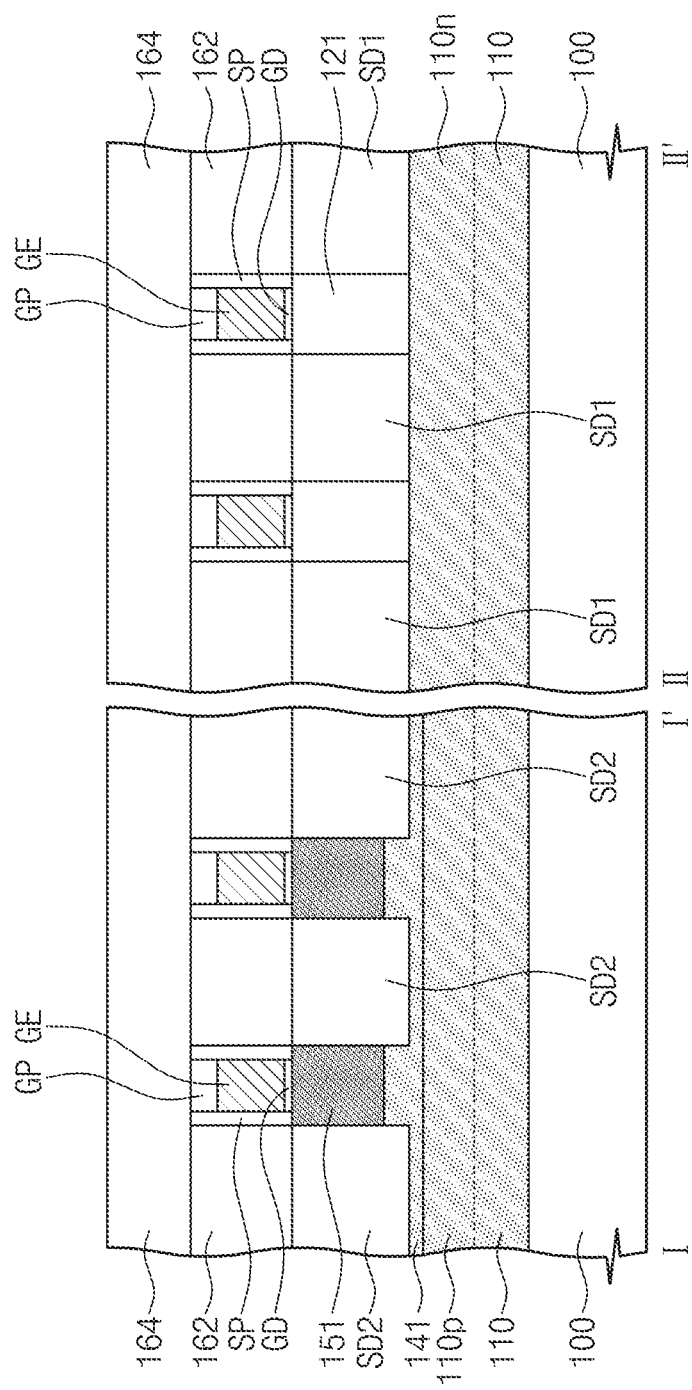
Figure 19B:
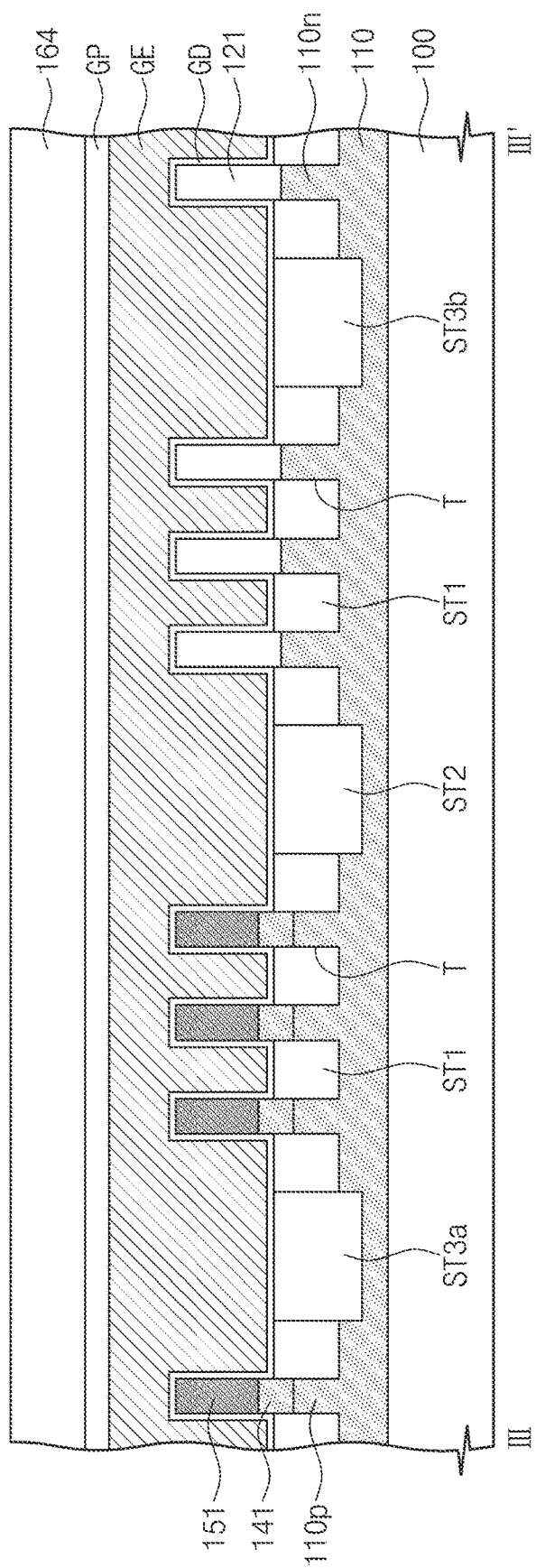

Unlike that described above, the gate structures may be formed by a gate last process, as shown in FIGS. 19A and 19B. For example, the formation of the gate structures may include forming sacrificial gate patterns (not shown) to cross the first and second channel semiconductor patterns 121 and 151, forming the gate spacers SP on both side surfaces of the sacrificial gate patterns, forming a lower interlayered insulating layer 162 to cover the gate spacers SP and expose top surfaces of the sacrificial gate patterns, removing the sacrificial gate patterns to form gate regions exposing the first and second channel semiconductor patterns 121 and 151 between the gate spacers SP, and then, forming, for example sequentially forming the gate dielectric pattern GD, the gate electrode GE, and the gate capping pattern GP in the gate regions. In this case, the source/drain regions SD1 and SD2 may be formed by an ion implantation process, which may be performed after the formation of the gate spacers SP and before the formation of the lower interlayered insulating layer 162. In addition, an upper interlayered insulating layer 164 may be formed on the lower interlayered insulating layer 162 to cover the top surfaces of the gate structures. The lower and upper interlayered insulating layers 162 and 164 may correspond to the interlayered insulating layer 160 described with reference to FIGS. 18A and 18B.

According to some example embodiments of the inventive concepts, a channel semiconductor layer, whose lattice constant is higher than the lattice constant of a substrate, may be provided on the substrate, and two CMP processes using two different CMP slurries may be performed on the channel semiconductor layer. Accordingly, it is possible to effectively planarize a top surface of the channel semiconductor layer and to reduce or prevent a surface damage to the channel semiconductor layer.

Although detailed embodiments of inventive concepts have been described, it should be understood that numerous other modifications, changes, variations, and substitutions can be devised by those skilled in the art. Moreover, it should be understood that the inventive concepts cover various techniques which can be readily modified and embodied based on the above-described embodiments).

What is claimed is:

1. A patterning method for fabricating a semiconductor device, comprising:
   forming a lower buffer layer, a first channel semiconductor layer, and a capping insulating layer on a substrate, the first channel semiconductor layer including a material having a lattice constant that is lower than a lattice constant of the lower buffer layer;
   forming an opening to penetrate the capping insulating layer and the first channel semiconductor layer and to expose a portion of the lower buffer layer;
   forming a second channel semiconductor layer to fill the opening, the second channel semiconductor layer including a first portion protruding upwardly with respect to a top surface of the capping insulating layer and including a material having a lattice constant that is higher than the lattice constant of the lower buffer layer;
   performing a first CMP process to remove at least a portion of the first portion of the second channel semiconductor layer;
   removing the capping insulating layer to expose a top surface of the first channel semiconductor layer; and
   performing a second CMP process to remove at least a portion of a second portion of the second channel semiconductor layer protruding upwardly with respect to the top surface of the first channel semiconductor layer,
   wherein the first CMP process is performed using a first CMP slurry, and
   the second CMP process is performed using a second CMP slurry, which is selected to allow the second semiconductor layer to be polished at a lower polishing rate than a polishing rate of the first CMP slurry.

2. The method of claim 1, wherein
   the first CMP process is performed to polish the first portion at a first polishing rate, and
   the second CMP process is performed to polish the second portion at a second polishing rate lower than the first polishing rate.

3. The method of claim 1, wherein the first CMP process is performed to allow a ratio in polishing rate of the first portion to the capping insulating layer to be in a range of from 40:1 to 100:1.

4. The method of claim 1, wherein the first CMP slurry includes an acidic or basic solution containing a first polishing particle, a first oxidizing agent, a first pH regulator, and a polishing regulator, and
   the second CMP slurry includes an acidic solution containing a second polishing particle, a second oxidizing agent, and a second pH regulator.

5. The method of claim 1, wherein the lower buffer layer and the first channel semiconductor layer are formed by an epitaxial growth process using the substrate as a seed layer.

6. The method of claim 1, wherein the second channel semiconductor layer is formed by a selective epitaxial growth process, in which the first channel semiconductor layer and the lower buffer layer in the opening are used as a seed layer.

7. The method of claim 1, further comprising:
forming an upper buffer layer in the opening, before the forming of the second channel semiconductor layer.

8. A method of fabricating a semiconductor device, comprising:
preparing a substrate having a logic cell region, the logic cell region including an NMOSFET region and a PMOSFET region;
forming a first channel semiconductor pattern and a second channel semiconductor pattern on the NMOSFET region and the PMOSFET region, respectively; and
forming a gate electrode to cross both of the first and second channel semiconductor patterns,
wherein the forming of the first and second channel semiconductor patterns includes,
forming a lower buffer layer, a first channel semiconductor layer, and a capping insulating layer on the substrate,
removing at least a portion of the capping insulating layer and at least a portion of the first channel semiconductor layer to form an opening exposing the lower buffer layer on the PMOSFET region,
forming a second channel semiconductor layer to fill the opening and include a first portion protruding upwardly with respect to a top surface of the capping insulating layer,
performing a first CMP process to remove at least a portion of the first portion of the second channel semiconductor layer, removing the capping insulating layer to expose a top surface of the first channel semiconductor layer, and
performing a second CMP process to remove at least a portion of a second portion of the second channel semiconductor layer protruding upwardly with respect to the top surface of the first channel semiconductor layer; and
patterning the first and second channel semiconductor layers to form trenches defining the first and second channel semiconductor patterns,
wherein the first CMP process is performed using a first CMP slurry, and
the second CMP process is performed using a second CMP slurry, which is selected to allow the second semiconductor layer to be polished at a lower polishing rate than a polishing rate of the first CMP slurry.

9. The method of claim 8, wherein
the first CMP process is performed to polish the first portion at a first polishing rate, and
the second CMP process is performed to polish the second portion at a second polishing rate lower than the first polishing rate.

10. The method of claim 8, wherein the first CMP process is performed to allow a ratio in polishing rate of the first portion to the capping insulating layer to be in a range of from 40:1 to 100:1.

11. The method of claim 8, wherein
the first channel semiconductor layer includes a material having a same lattice structure as the lower buffer layer and having a lattice constant that is lower than a lattice constant of the lower buffer layer, and
the second channel semiconductor layer includes a material having a same lattice structure as the lower buffer layer and having a lattice constant that is higher than the lattice constant of the lower buffer layer.

12. The method of claim 8, further comprising:
forming device isolation layers in the trenches, wherein the device isolation layers are formed to expose upper portions of the first and second channel semiconductor patterns.

13. The method of claim 8, further comprising:
forming first source/drain regions at both sides of the gate electrode on the NMOSFET region; and
forming second source/drain regions at both sides of the gate electrode on the PMOSFET region,
wherein the first source/drain regions have a different conductivity type from the second source/drain regions.

14. The method of claim 8, further comprising:
forming an upper buffer layer in the opening, before the forming of the second channel semiconductor layer.

15. The method of claim 14, wherein the upper buffer layer includes the same material as the lower buffer layer.

16. The method of claim 8, wherein
the logic cell region comprises a first logic cell region and second and third logic cell regions, which are spaced apart from each other in a first direction with the first logic cell region interposed therebetween,
the first channel semiconductor pattern is formed on the NMOSFET region of at least one of the first to third logic cell regions, and
the second channel semiconductor pattern is formed on the PMOSFET region of at least one of the first to third logic cell regions.

17. A method of fabricating a semiconductor device, the method comprising:
forming a first buffer layer, a first channel semiconductor layer and a capping layer on a substrate;
forming an opening in a portion of the first channel semiconductor layer and the capping layer to expose the first buffer layer;
forming a second buffer layer in the opening;
forming a second channel semiconductor layer on the second buffer layer to fill the opening; and
planarizing the second channel semiconductor layer by removing a protruding portion of the second channel semiconductor layer with respect to the first channel semiconductor layer via more than one polishing step;
wherein the more than one polishing step include:
performing a first polishing of an upper surface of the second channel semiconductor layer;
exposing a portion of the upper surface of the first channel semiconductor layer that is covered by the capping layer by removing the capping layer; and
performing a second polishing of the second channel semiconductor layer to render the upper surface of the second channel semiconductor substantially flush with the upper surface of the first channel semiconductor layer.

18. The method of claim 17, wherein the second polishing of the second semiconductor layer has a lower polishing rate than the first polishing of the second semiconductor layer.

19. The method of claim 17, wherein
the first channel semiconductor layer includes a material having a lattice constant that is lower than a lattice constant of the first buffer layer; and the second channel semiconductor layer includes a material having a lattice constant that is higher than the lattice constant of the first buffer layer.

\* \* \* \* \*